(12) United States Patent
Zhou

(10) Patent No.: US 7,911,672 B2
(45) Date of Patent: Mar. 22, 2011

(54) MICRO-ELECTRO-MECHANICAL-SYSTEM MICROMIRRORS FOR HIGH FILL FACTOR ARRAYS AND METHOD THEREFORE

(76) Inventor: Tiansheng Zhou, Edmonton (CA)

( * ) Notice: Subject to any disclaimer, the term of this patent is extended or adjusted under 35 U.S.C. 154(b) by 532 days.

(21) Appl. No.: 11/950,721

(22) Filed: Dec. 5, 2007

(65) Prior Publication Data

US 2008/0151345 A1    Jun. 26, 2008

Related U.S. Application Data

(60) Provisional application No. 60/877,037, filed on Dec. 26, 2006.

(51) Int. Cl.
*G02B 26/08* (2006.01)

(52) U.S. Cl. ............. 359/224.1; 359/199.2; 359/200.6; 359/201.2

(58) Field of Classification Search .... 359/199.1–199.2, 359/200.6, 224.1–224.2
See application file for complete search history.

(56) References Cited

U.S. PATENT DOCUMENTS

| | | | |
|---|---|---|---|
| 5,083,857 A | 1/1992 | Hornbeck |
| 5,202,785 A | 4/1993 | Nelson |
| 5,212,582 A | 5/1993 | Nelson |
| 5,233,456 A | 8/1993 | Nelson |
| 5,583,688 A | 12/1996 | Hornbeck |
| 5,734,492 A | 3/1998 | Chung |
| 5,735,026 A | 4/1998 | Min |
| 5,760,947 A | 6/1998 | Kim et al. |
| 6,028,690 A | 2/2000 | Carter et al. |
| 6,046,840 A | 4/2000 | Huibers |
| 6,204,080 B1 | 3/2001 | Hwang |
| 6,694,073 B2 | 2/2004 | Golub et al. |
| 6,760,145 B1 | 7/2004 | Taylor et al. |
| 6,778,728 B2 | 8/2004 | Taylor et al. |
| 6,781,744 B1 | 8/2004 | Aksyuk et al. |
| 6,822,776 B2 | 11/2004 | Hah et al. |
| 6,838,738 B1 | 1/2005 | Costello et al. |
| 6,934,439 B2 | 8/2005 | Mala et al. |
| 6,965,468 B2 | 11/2005 | Huibers |
| 6,969,635 B2 | 11/2005 | Patel et al. |
| 6,970,281 B2 | 11/2005 | Huibers et al. |
| 6,972,891 B2 | 12/2005 | Patel et al. |
| 6,980,347 B2 | 12/2005 | Patel et al. |
| 6,985,277 B2 | 1/2006 | Huibers et al. |
| 7,053,981 B2 | 5/2006 | Bleeker |
| 7,091,057 B2 | 8/2006 | Gan et al. |
| 7,095,546 B2 | 8/2006 | Mala et al. |
| 7,209,274 B2 | 4/2007 | Van Drieenhuizen |
| 2004/0085606 A1 | 5/2004 | Valette |
| 2005/0280883 A1 | 12/2005 | Seo et al. |

*Primary Examiner* — James Phan
(74) *Attorney, Agent, or Firm* — Davis & Bujold, P.L.L.C.

(57) ABSTRACT

A micro-electro-mechanical-system (MEMS) micromirror for use in high fill factor arrays which includes at least one stationary body and a movable body. The movable body has opposed ends and is secured to the stationary body at each of the opposed ends by a resilient primary axis pivot. A mirror support is supported by and movable with the movable body. The mirror support has a first unfettered side and a second unfettered side. A primary axis actuator is provided including a fixed portion connected to the stationary body, and a movable portion corrected to the movable body. The movable portion is adapted to move away from the fixed portion in response to an electrical potential difference between the fixed portion and the movable portion, such that the movable body rotates about the primary axis resilient pivot. A mirror is supported by the mirror support.

20 Claims, 29 Drawing Sheets

Taper shape hinge

Double beam hinge

MICRO-ELECTRO-MECHANICAL-SYSTEM MICROMIRRORS FOR HIGH FILL FACTOR ARRAYS AND METHOD THEREFORE

TECHNICAL FIELD

The present invention is directed towards a MEMS (Micro-Electro-Mechanical-system) micromirror with one or two dimensional rotation and micromirror arrays with a high fill factor.

BACKGROUND

The MEMS (Micro-Electro-Mechanical Systems) mirrors and mirror arrays have wide applications in the light process and fiber optic networks such as in optical cross-connect switches, attenuators, wavelength blocker, dynamic gain equalizer, configurable grating and tunable filter etc. The MEMS mirror arrays with high fill factors and two axes rotation have particular importance in the wavelength division multiplexing systems. Tile fill factor is generally defined as the ratio of the active area to the total area in an array. The high fill factor improves optical channel shape and reduces the optical loss in the system. A micromirror with two axes of rotation can provide switching of the optical beam among the channels while avoiding undesirable optical transient crosstalk during switching, and achieving variable optical attenuations.

There are a number of actuation methods for the MEMS micromirror array such as electromagnetic actuation disclosed in U.S. Pat. No. 6,760,145 B1, thermal actuation disclosed in U.S. Pat. No. 7,091,057 B2, and electrostatic actuation disclosed in U.S. Pat. No. 7,095,546 B2. Electrostatic actuation is favored due to its low power consumption and relative simple structure and small footprint.

Existing micromirrors with electrostatic actuation fall into two categories: vertical combdrive type micromirrors and parallel plate type micromirrors. The drawback for conventional vertical combdrive type micromirrors is its failing to form the high fill factor arrays due to its typical gimbaled and framed structure. Since it is difficult to reduce the gap between adjacent micromirrors, it is hard to form a mirror array with high fill factor. One of these kinds of MEMS micromirrors was disclosed in U.S. Pat. No. 6,822,776 B2.

It is much easier to form high fill factor mirror arrays based on the parallel plate type of actuators. The majority of existing high fill factor micromirror array designs use parallel plate type electrostatic actuators, such as those taught in U.S. Pat. Nos. 7,095,546, 6,934,439, 6,694,073, 6,781,744, 6,778,728, 7,209,274 and 7,053,981. The advantage of using a parallel plate electrostatic actuator is that no typical gimbaled structure or frame is required for the design. As such, the gap between the mirrors can be very small to form a high fill factor mirror array. However, there are several disadvantages for the micromirror array using parallel plate electrostatic actuators.

First of all, the pull-in effect of parallel plate type electrostatic actuator of micromirror limits the controllable tilting angle range under the certain actuation voltage. When an actuation voltage is applied between the fixed electrode and the movable hinged mirror, the resulting attractive electrostatic force will pull the mirror towards the fixed electrode to create tilting of hinged mirror. Initially, the restoring force from deformed hinge will balance the electrostatic force to keep the mirror in the controllable position. But when the actuation voltage is further increased, and the tilting of the hinged mirror is over one third of the initial gap between tie fixed electrode and the mirror, the electrostatic force between the electrode and the mirror surpasses the mechanical restoring force of the hinges, such that the hinged mirror will snap and physically contact die fixed electrode. Thus, the usable and controllable tilting range of the mirror is limited to only one third of the gap between the mirror and fixed electrode. Furthermore, even within the small controllable titling range, the parallel plate electrostatic actuator won't provide linear actuation. In other word, the mirror tilting angle is not linear with the actuation voltage.

Secondly, a high actuation voltage creates issues with respect to electrical charging, tilting angle drifting, and crosstalking between adjacent mirrors. In order to have a larger controllable titling angle for the mirror, the gap between the fixed electrode and the mirror has to be increased. This increased gap results in a higher actuation voltage. Often, several hundreds of volts have to be used to obtain a couple of degrees of mirror titling. Such higher driving voltage causes electrical charging on the dielectrical materials of the mirror device, which will in turn cause the undesired tilting angle drifting of the mirror. Also it is very difficult to shield the electrical field from one mirror actuation electrode to interfere the performance of the adjacent mirrors.

Thirdly, there is a mechanical coupling between the two axes rotation for the micromirror. In the micromirrors disclosed in U.S. Pat. Nos. 7,095,546, 6,934,439, 6,694,073, 6,781,744, 6,778,728, 7,209,274 and 7,053,981, the actuation about one axis rotation will cause the move of the mirror about the other axis. This coupling of two axes rotation makes operation control of the device complicated, and unreliable.

Fourthly, squeezed air between the movable mirrors and the fixed electrodes during tilting will lead to interference among adjacent mirrors. Since the space between the movable mirror and fixed electrode is very small, and the gap between the adjacent mirrors is also small to obtain a high fill factor, the fast titling/switching of one mirror will cause the air film between its mirror and fixed electrode to be either compressed or decompressed. As such, the air flow will be formed. The air flow resulting from the switching of one mirror will therefore interfere with the adjacent mirrors, and cause them to tilt. Furthermore, the air damping from the squeezed air film will effectively lower the switching speed of the mirror.

Lastly, the microfabrication process is costly and complex, especially for making complex actuation electrodes and electrical wirings of two dimensional rotation mirrors.

SUMMARY

There is provided a micro-electro-mechanical-system (MEMS) micromirror for use in high fill factor arrays which includes at least one stationary body and a movable body. The movable body has opposed ends and is secured to the stationary body at each of the opposed ends by a resilient primary axis pivot. A mirror support is supported by and movable with the movable body. The mirror support has a first unfettered side and a second unfettered side. A primary axis actuator is provided including a fixed portion connected to the stationary body, and a movable portion connected to the movable body. The movable portion is adapted to move away from the fixed portion in response to an electrical potential difference between the fixed portion and the movable portion, such that the movable body rotates about the primary axis resilient pivot. A mirror is supported by the mirror support.

BRIEF DESCRIPTION OF THE DRAWINGS

These and other features will become more apparent from the following description in which reference is made to the appended drawings, the drawings are for the purpose of illustration only and are not intended to be in any way limiting, wherein:

FIG. 7b is an enlarged perspective view of detail A of the trench refilling depicted in FIG. 7a.

FIG. 13b is an enlarged perspective view of detail B of the metal contact tab on the top of glass supporter depicted in FIG. 13a.

FIG. 16b is an enlarged perspective view of detail C of the partially etched buried oxide layer depicted in FIG. 16a.

FIG. 17b is an enlarged perspective view of detail D of the patterned buried oxide depicted in FIG. 17a.

FIG. 18b is an enlarged perspective view of detail E of the comb fingers after through device layer DRIE etching depicted in FIG. 18a.

FIGS. 19b, 19c and 19d are enlarged perspective views of details F, G and H, respectively, of the comb fingers depicted in FIG. 19a.

FIG. 24b is an enlarged perspective view of detail I of the tilting detection feature for primary rotation in FIG. 24a.

DETAILED DESCRIPTION

Figure 1:
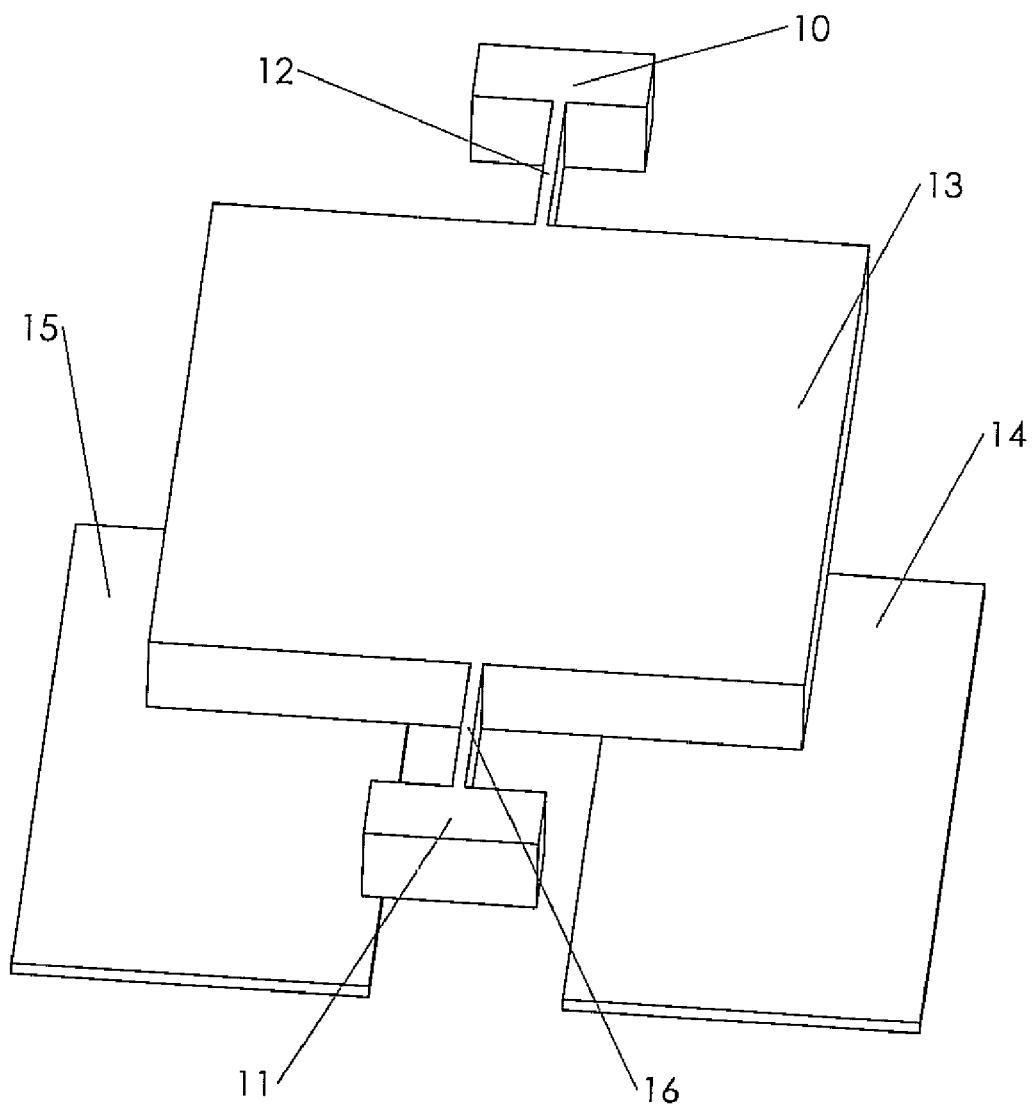
FIG. 1 is a perspective view of a prior art micromirror using a conventional parallel plate type electrostatic actuator.

While the device described below is susceptible of embodiments in many different forms, there is shown in the drawings and will herein be described in detail, preferred embodiments with the understanding that the present disclosure is to be considered as an exemplification of the principles of the device and is not intended to limit the broad aspects of the device to the embodiments illustrated. The figures are not necessarily drawn to scale and relative sizes of various elements in the structures may be different than in an actual device.

A micromirror with parallel plate electrostatic actuators known in the art is shown in FIG. 1. The mirror 13 is coated with reflective materials such as a metal film, and is supported by two hinges 12 and 16 which are connected to the anchors 10 and 11. Two fixed actuation electrodes 14 and 15 are located below mirror 13. Mirror 13, hinges 12 and 16 and anchors 10 and 11 can be made of doped conductive silicon. When the actuation voltage is applied between mirror 13 and electrode 14, the resulting electrostatic force will pull mirror 13 towards electrode 14 and cause the deformation of hinges 12 and 16. Mien the electrostatic force is balanced with the mechanical restoring force of the deformed hinges, mirror 13 will stabilize at a tilting angle. The disadvantages of the parallel plate electrostatic actuator, such as the pull-in effect, tilting angle drifting and cross-talking between adjacent mirrors, squeezed air damping, etc., yield poor performance for high fill factor micromirror and micromirror arrays, as well as very complex, low production yield and expensive manufacturing methods.

Figure 2:
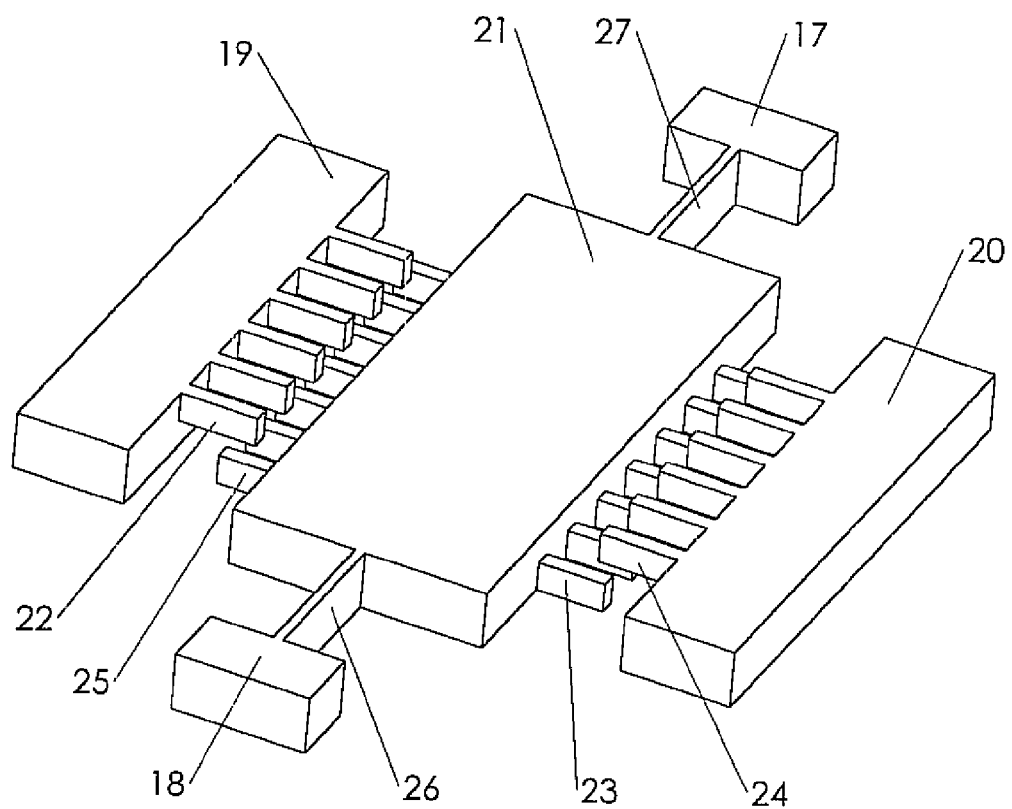
FIG. 2 is a perspective view of a micromirror using electrostatic vertical combdrive actuators.

To overcome these problems and to obtain micromirrors and micromirror arrays with a high fill factor, a vertical electrostatic combdrive actuator design may be used. One example of such a vertical electrostatic combdrive is shown in FIG. 2. The advantages of the vertical combdrive over the parallel plate electrostatic actuator include higher actuation force density, better actuation linearity, and no pull-in effects. The micromirror design and the fabrication method for the micromirror array as discussed below reduce the effect of tilting angle drifting and cross-talking between adjacent mirrors as well as squeezed air damping. The mirror 21 is fixed to the anchors 17 and 18 by hinges 26 and 27. The fixed electrodes 19 and 20 have fixed sets of upper comb fingers 22 and 24. The movable sets of lower comb fingers 23 and 25 are on the outside edges of mirror 21. When an actuation voltage is only applied between moveable lower fingers 23 and fixed upper comb fingers 24, the resulting electrostatic force will pull mirror 21 counterclockwise around hinge 26 and 27, and cause hinges 26 and 27 to deform. Mirror 21 will reach a stable position when the electrostatic force is balanced with the resulting mechanical restoring force of the deformed hinges 26 and 27. If the actuation voltage is only applied between fixed upper comb fingers 22 and movable lower comb fingers 25, mirror 21 will rotate around the hinge 26 and 27 clockwise instead. The micromirror shown uses different upper and lower finger designs to achieve the direction control of the mirror rotation. This vertical combdrive design is such that when mirror 21 is electrically grounded, an applied voltage on either of the two fixed electrodes 19 and 20 will independently rotate the mirror and cause it to tilt into two different directions, either clockwise or counterclockwise.

Figure 3:
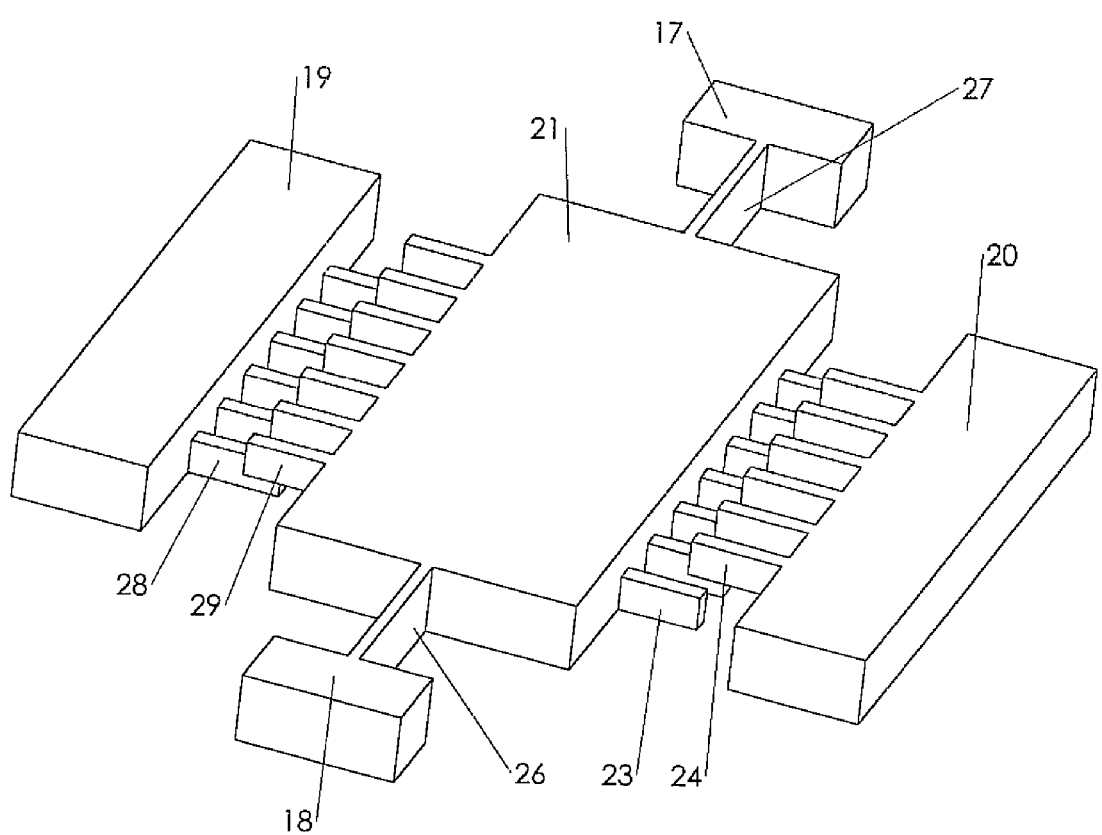
FIG. 3 is a perspective view of a design variation of the electrostatic vertical combdrive actuator.

Referring to FIG. 3, the vertical combdrive design shown has different upper and lower comb finger arrangements. The mirror 21 has upper comb fingers 29 and lower fingers 23 on its outside edge. Fixed electrode 19 has fixed lower comb fingers 28, while fixed electrode 20 has upper comb fingers 24. If an electrical potential is applied on both fixed electrodes 19 and 20 when mirror 21 and associated upper fingers 29 and lower fingers 23 are electrically grounded, the mirror will rotate counterclockwise. The combdrives on both sides of the mirror 21 will thus work together to actuate the mirror in the same direction. The advantages of such design are a reduction in the actuation voltage for certain mirror tilting angles, and that the resulting unbalanced force on the hinges is eliminated, which can cause the up or down piston translation movement of the mirror besides the desired mirror rotation.

Figure 4:
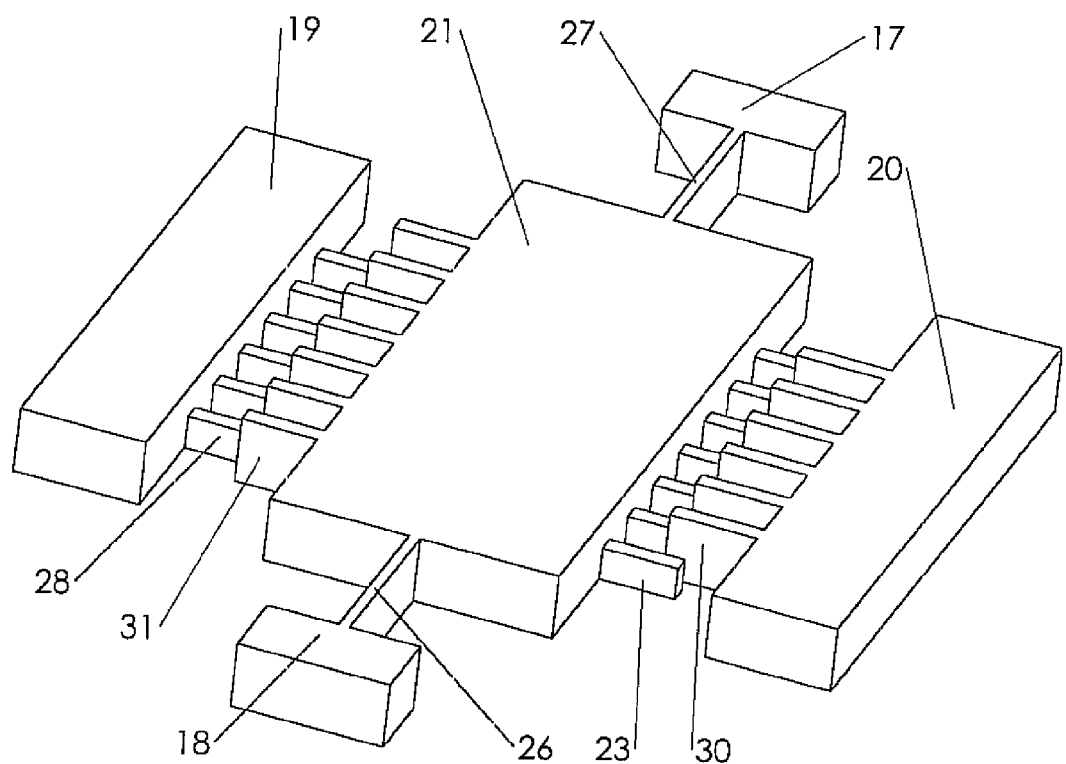
FIG. 4 is a perspective view of another design variation of the electrostatic vertical combdrive actuator.

The vertical combdrive designs shown in FIGS. 2 and 3 have upper comb fingers, which are formed by removing the materials from its lower part. Another comb finger arrangement option is shown in FIG. 4, where the material is kept on the lower part of the finger. This design simplifies the fabrication process, but it increases the driving voltage to achieve the same mirror titling angle compared with the comb finger designs shown in FIGS. 2 and 3.

It will be understood that a micromirror or a micromirror array may use any of the three comb finger arrangements shown in FIG. 2, FIG. 3 and FIG. 4 for its vertical combdrive actuators. In the following description of the microfabrication method for micromirrors and micromirror arrays, only comb finger designs shown in FIG. 2 and FIG. 3 will be included since the comb finger design shown in FIG. 4 does not require all the steps in the process to make the vertical combdrive actuator shown in FIG. 2 and FIG. 3. Furthermore, the following process description is one example of a microfabrication method designed for the micromirror and the high fill factor micromirror array. Those skilled in the art will recognize that there are other alternative microfabrication methods, and that the description below is a representative fabrication method for the micromirror and micromirror array. Furthermore, only the major process steps for fabricating the mirror and micromirror array will be described.

Figure 5:
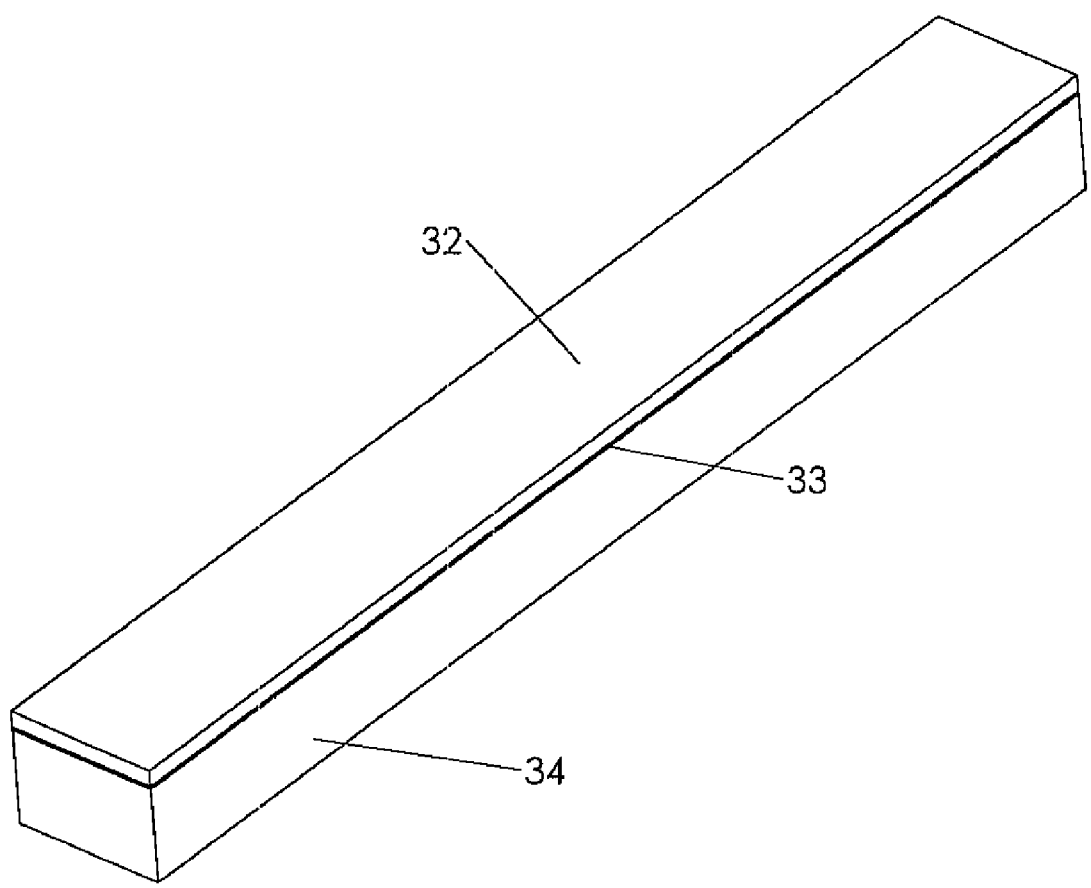
FIG. 5 is a perspective view of a Silicon On Insulator (SOI) wafer.

The micromirror and micromirror array and corresponding vertical combdrive actuators are made from a single crystal silicon device layer of Silicon On Insulator (SOI) wafer shown in FIG. 5. The thinner single crystal silicon device layer 32 is bonded to the handle silicon wafer 34 with Buried Oxide (BOX) layer 33. The SOI wafer can be purchased commercially from SOI wafer vendors, or can be made using some well known method such as fusion bonding and etching back process. The single crystal device silicon should be heavily doped to have good electrical conductivity.

Since, in some applications, each micromirror needs to be controlled to rotate two dimensionally, and the actuators for primary and secondary rotation are made on the same conductive single crystal device layer, the primary actuator should be electrically isolated from the secondary actuator in order to have independent actuation. A trenching and dielectric material refilling method is used in the microfabrication method described below.

Figure 6:
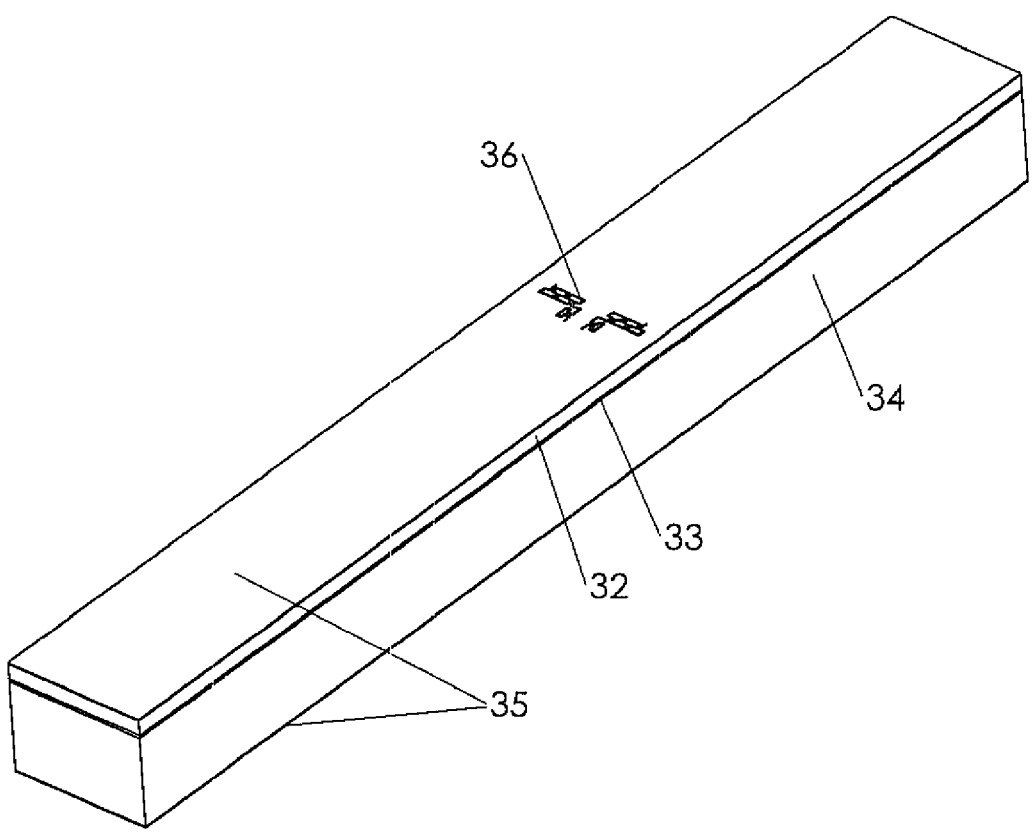
FIG. 6 is a perspective view of the SOI wafer of FIG. 5 after being trenched by deep reactive ion etching (DRIE).

The SOI wafer shown in FIG. 5 may have a thin nitride film grown on both the top and bottom sides using Low Pressure Chemical Vapor Deposition (LPCVD). Lithography is then used to define the specific shape for the trench on silicon device layer of the SOI wafer. It is very important to have good electrical isolation while maintaining strong mechanical strength when designing the trench shape. After Reactive Ion Etching (RIE) of silicon nitride layer 35 as shown in FIG. 6 and Deep Reactive Ion Etching (DRIE) of silicon device layer 32, a hollow trench 36 of several microns wide is formed on the single crystal device layer 32. The BOX layer 33 is used as a DRIE etching stop layer. Simple photoresist or other materials can be used as the RIE and DRIE etching mask. A single trench or multiple parallel trenches should be formed in order to have good electrical isolation and mechanical strength. A single trenching 36 is shown in FIG. 6 after stripping RIE and DRIE etch masking material.

Figure 7A:
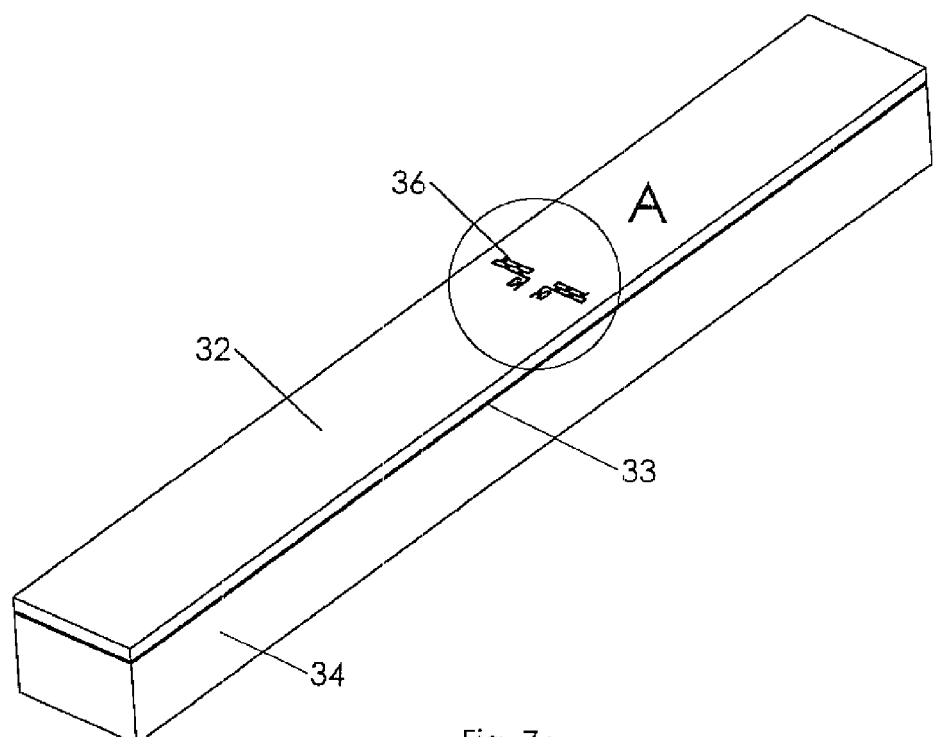
FIG. 7a is a perspective view of the SOI wafer after trench refilling.
Figure 7B:
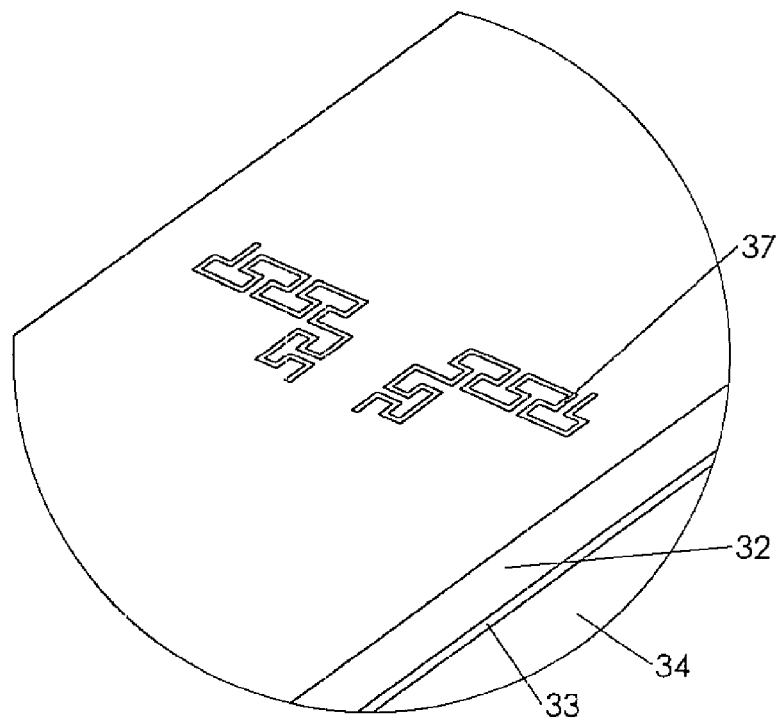

The processed SOI wafer is then sent to the thermal oxidation furnace for wet oxidation. Since the SOI wafer is covered with LPCVD nitride on the top and bottom sides, the oxidation will only occur on the sidewalls of the trench. The oxide formed from both sidewalls of the trench will meet each other to close the trench after a certain period of wet thermal oxidation. The LPCVD nitride thin films will prevent the growth of thermal oxide on both top and bottom sides of the SOI wafer, and are etched away using RIE shown in FIG. 7a. The trench 36 filled with wet thermal oxide 37 is shown in FIG. 7b.

There are many other options to do the trench etching and dielectric material refilling. For example, instead of filling the trench with oxide alone, polysilicon can be used to fill most of the trench after initial thin thermal oxide growth. The choice of the trench etching and refilling depends on the requirements of the micromirror and process cost.

Figure 8:
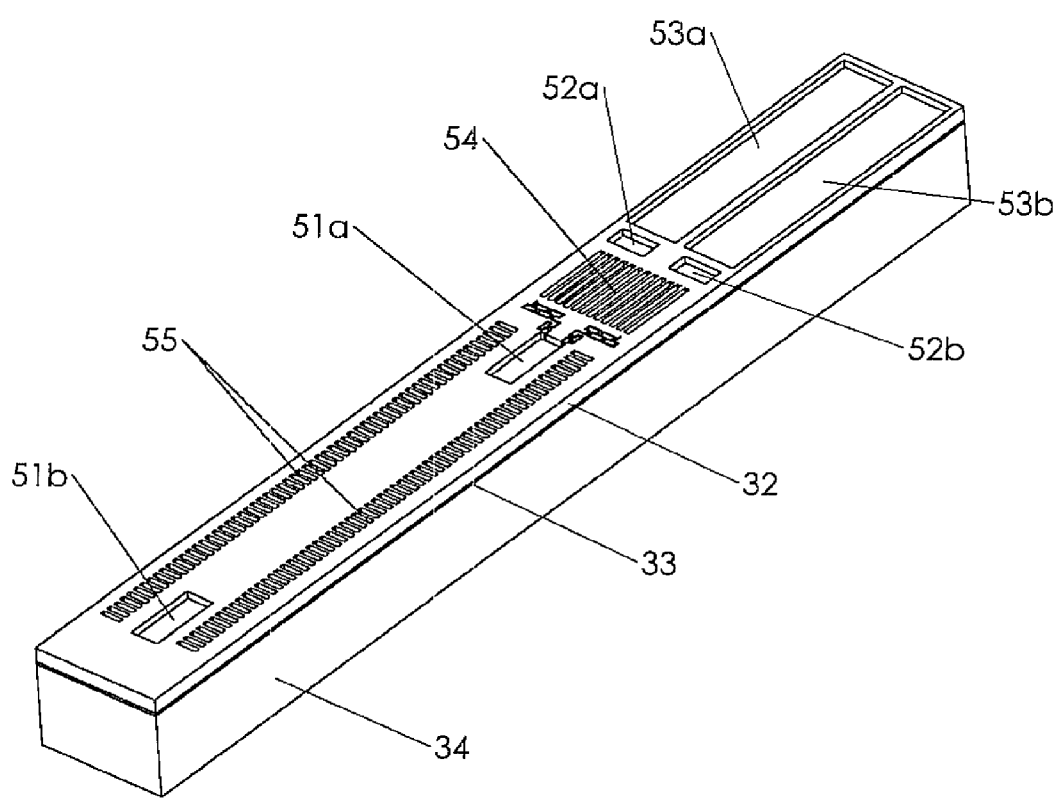
FIG. 8 is a perspective view of the SOI wafer after partial DRIE silicon etching.

After trench forming and dielectric material refilling, another photolithography process is performed on the device silicon layer for the subsequent partial silicon DRIE. The DRIE etching depth may be, for example, around half the thickness of the device silicon layer 32. The partial silicon DRIE step is used for multiple purposes. In FIG. 8, silicon DRIE is used in region 54 and 55 to remove the lower part of the silicon to form upper vertical comb fingers. Silicon DRIE may also be used in regions 51a, 51b, 52a and 52b in order to thin down the hinge heights to make them more flexible, which reduces the required actuation voltage. The silicon DRIE in regions 53a and 53b are on the backside the micromirror surface. As a result, the micromirror mass is reduced, and its resonant frequency is increased, without sacrificing the mirror structure strength and mirror flatness.

Figure 9:
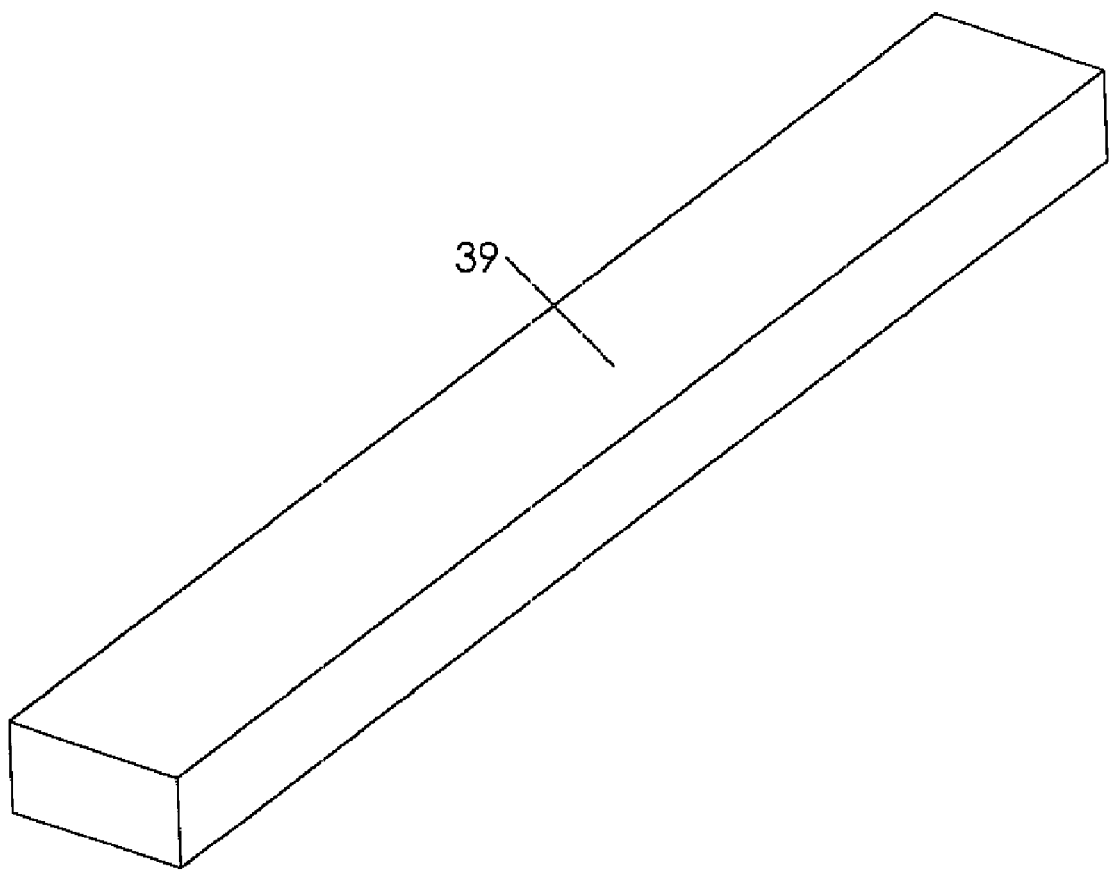
FIG. 9 is a perspective view of a carrier wafer.

A handle or carrier wafer 39 shown in FIG. 9 could be Pyrex glass or regular silicon wafer. After forming some supporting structures to support the anchors of vertical electrostatic combdrive actuators, and a large cavity under micromirrors to reduce or eliminate the squeezed air damping or squeezed air flow as discussed before, wafer 39 will be bonded to the SOI wafer produced above by using either fusion bonding, anodic bonding or other bonding techniques.

Figure 10:
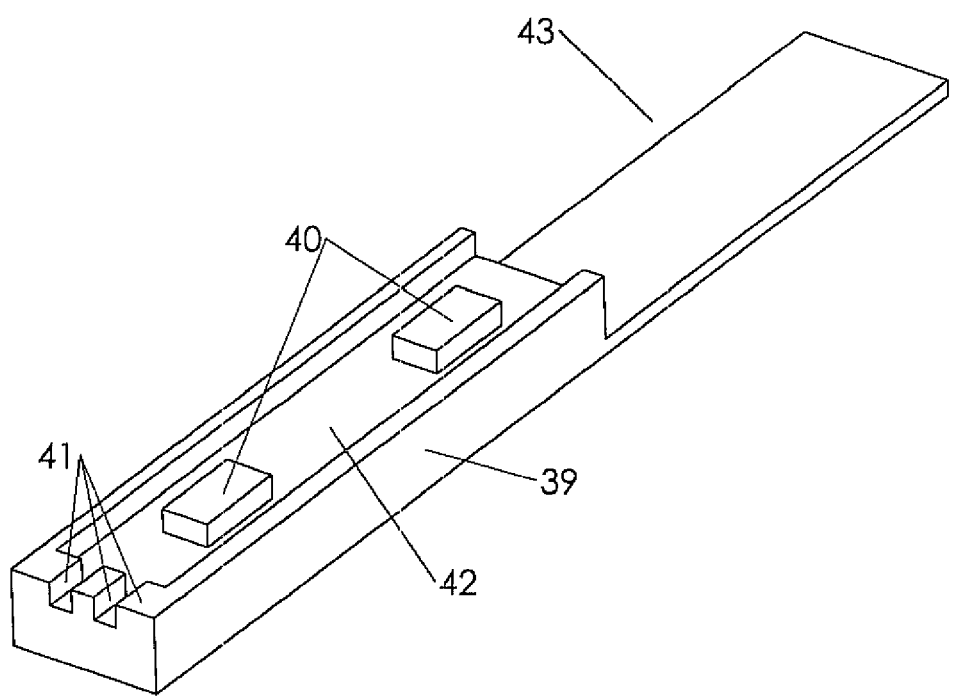
FIG. 10 is a perspective view of a silicon carrier wafer after deep cavity silicon etching and shallow silicon etching to form supporting structures.
Figure 11:
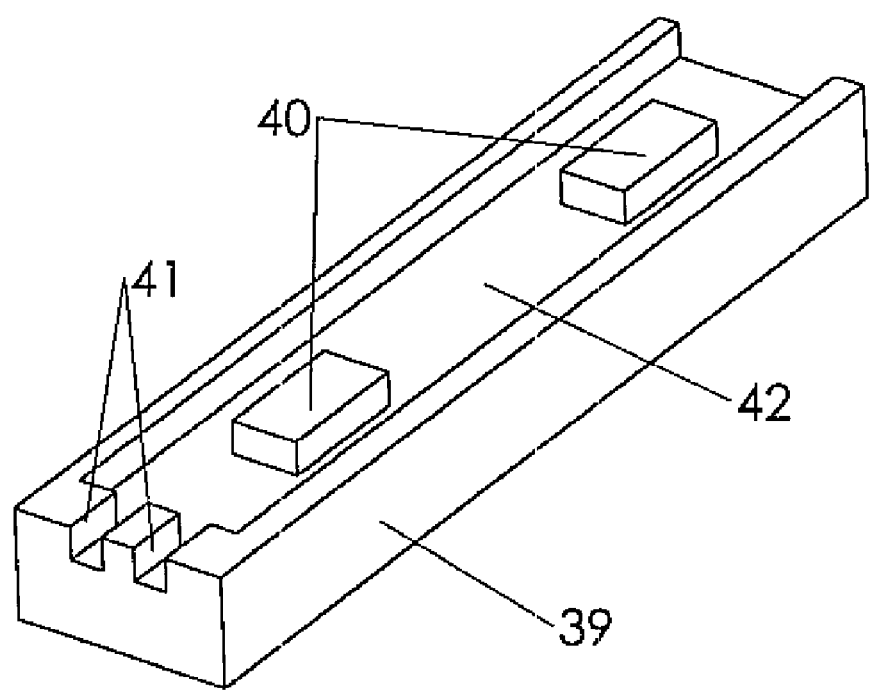
FIG. 11 is a perspective view of a silicon carrier wafer after through hole silicon etching and shallow silicon etching to form supporting structures.

In FIG. 10, if the wafer 39 is a regular silicon wafer, the lithographies and silicon DRIEs will be used to form the supports 40 and 41 by shallow silicon etching in region 42, and to form a deep cavity under the micromirror by deeper silicon etching in region 43. This may also be done by simply etching through the carrier wafer 39 to leave a hole under the micromirror as shown in FIG. 11. Other etching methods can also be used for this etching, such as wet silicon anisotropic etching in KOH (Potassium hydroxide) or TMAH (Tetramethylammonium hydroxide), etc. After silicon etching and before bonding with SOI wafer in the inert gases such as forming gases, a very thin thermal oxide will grow on the carrier silicon wafer in order for single crystal silicon device layer 32 of SOI wafer to be electrically isolated from the carrier silicon wafer 39.

Figure 12:
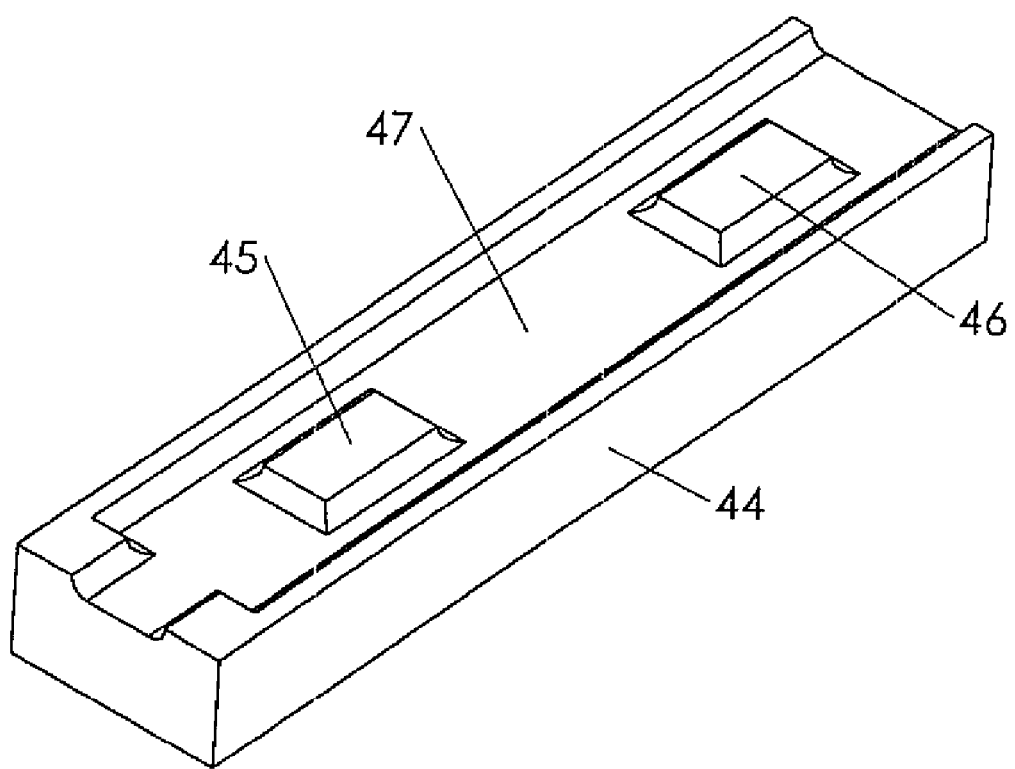
FIG. 12 is a perspective view of a glass carrier wafer after through hole machining and shallow glass etching to form supporting structures.

If Pyrex glass is chosen as the carrier wafer, the isotropic glass etching in HF (Hydrofluoric acid) will form the supports 45 and 46 by shallow glass etching in area 47 as shown in FIG. 12. While the through hole under micromirror on the glass carrier wafer is not shown in FIGS. 12 and 13, it can be made using wet HF etching, sand blasting, or laser micromaching.

Figure 13A:
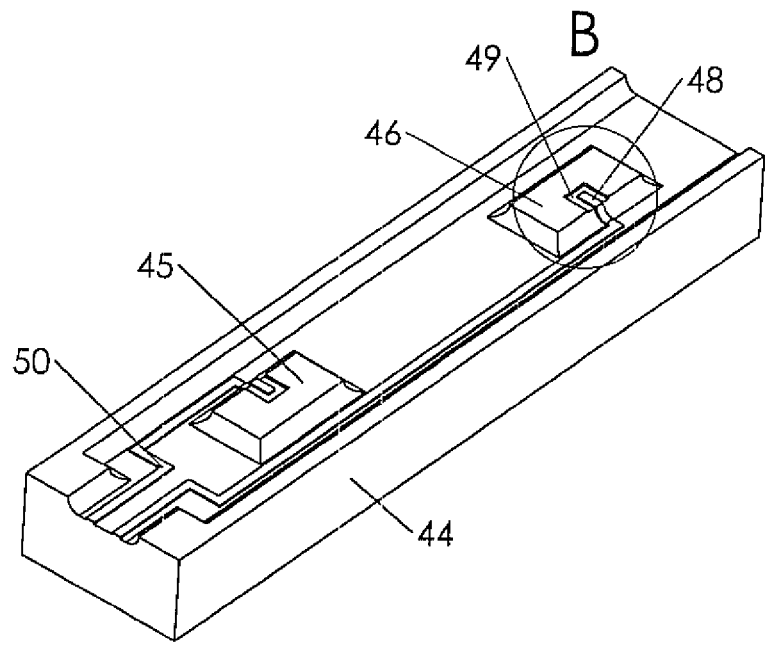
FIG. 13a is a perspective view of a glass carrier wafer after shallow glass etching on top of the supports and forming metal electrical interconnection wires.
Figure 13B:
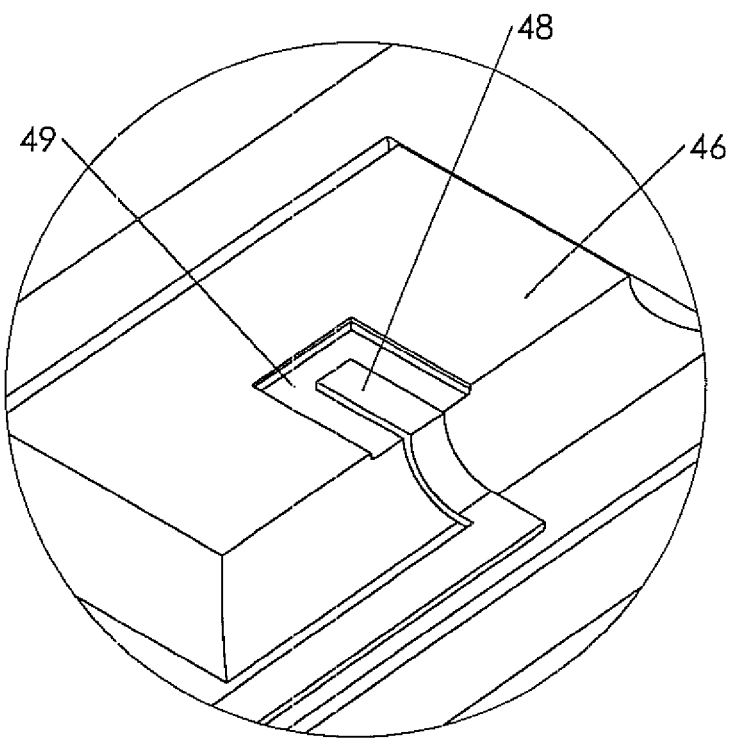

When electrical interconnections are required on the glass carrier wafer 39, very shallow glass etching is done in region 49 on the tops of supports 45 and 46 as shown in FIG. 13a. The shallow glass etching depth is little deeper than the deposited metal wire 50 thicknesses. As such, the device silicon layer of the SOI wafer will be intimately bonded to the supports 45 and 46 while still having electrical connection with the metal wires through the metal tab 48. A detailed view of glass support 46 with metal tab 48 and metal wire is shown in FIG. 13b. On the rest of bottom area of the shallow glass etched cavity, besides the metal electrical connections wires 50, the electrical ground metal film should be coated and patterned to prevent the glass charging issues.

Figure 14:
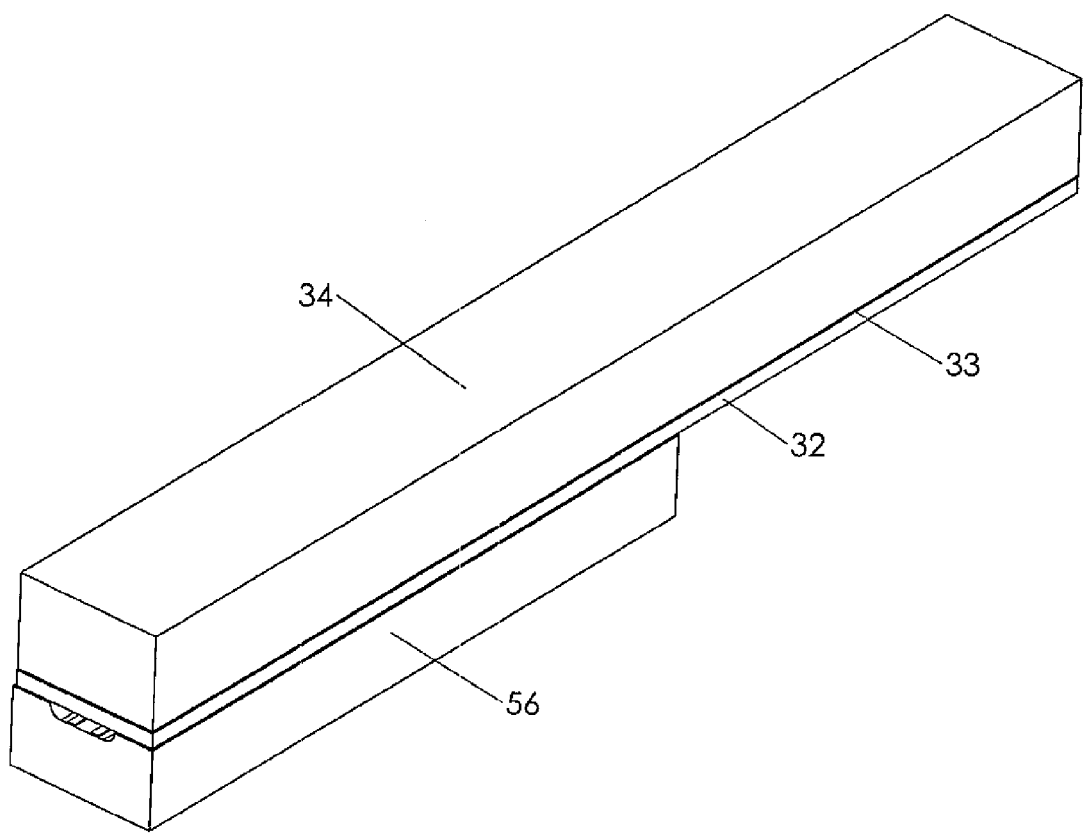
FIG. 14 is a perspective view of the SOI wafer in FIG. 8 bonded with a carrier wafer.
Figure 15:
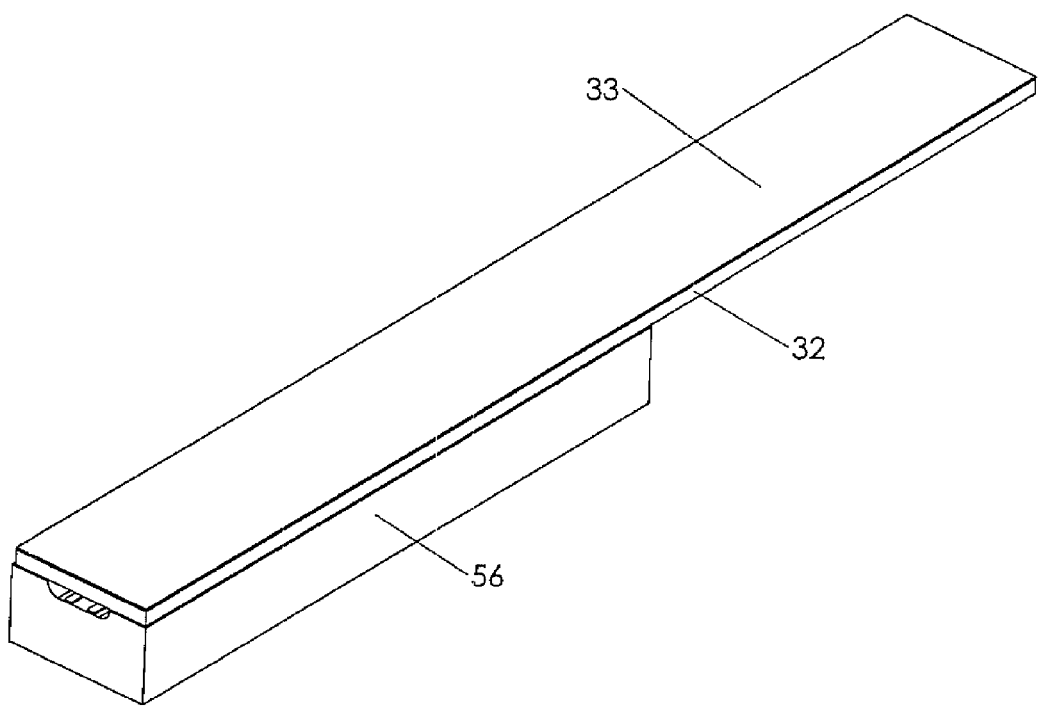
FIG. 15 is a perspective view of an etched away the handle wafer of SOI wafer.

The SOI wafer is bonded to the etched regular silicon carrier wafer or etched glass carrier wafer using fusing boding or anodic boding respectively. In the following process description, the glass carrier wafer with electrical wires and metal tabs will be used. The SOI wafer is bonded to the glass carries wafer using anodic bonding as shown in FIG. 14. If the glass carrier wafer has through etched holes, the bonded wafer set should be protected on tie glass side during the removal of the SOI handle wafer 34 in the subsequent KOH or TMAH bath to prevent the etchant from attacking the device silicon layer 32 through the through holes on the glass carrier wafer 56. The protection method can be as simple as using a wafer protection holder which seals the whole glass wafer and only exposes the handle wafer 34 of the SOI wafer in the KOH or TMAH bath. If the glass carrier wafer 56 only has deep etching cavity under micromirror, there is no need to have extra protect since the glass wafer itself will provide good protection to the single crystal silicon device layer 32 during KOH or TMAH silicon etching of the SOI handle wafer. The buried oxide layer 33 of the SOI wafer is the etching stop layer for KOH or TMAH silicon etching. The bonded wafer after SOI handle wafer removal is shown in FIG. 15, with a carrier wafer 56.

Figure 16A:
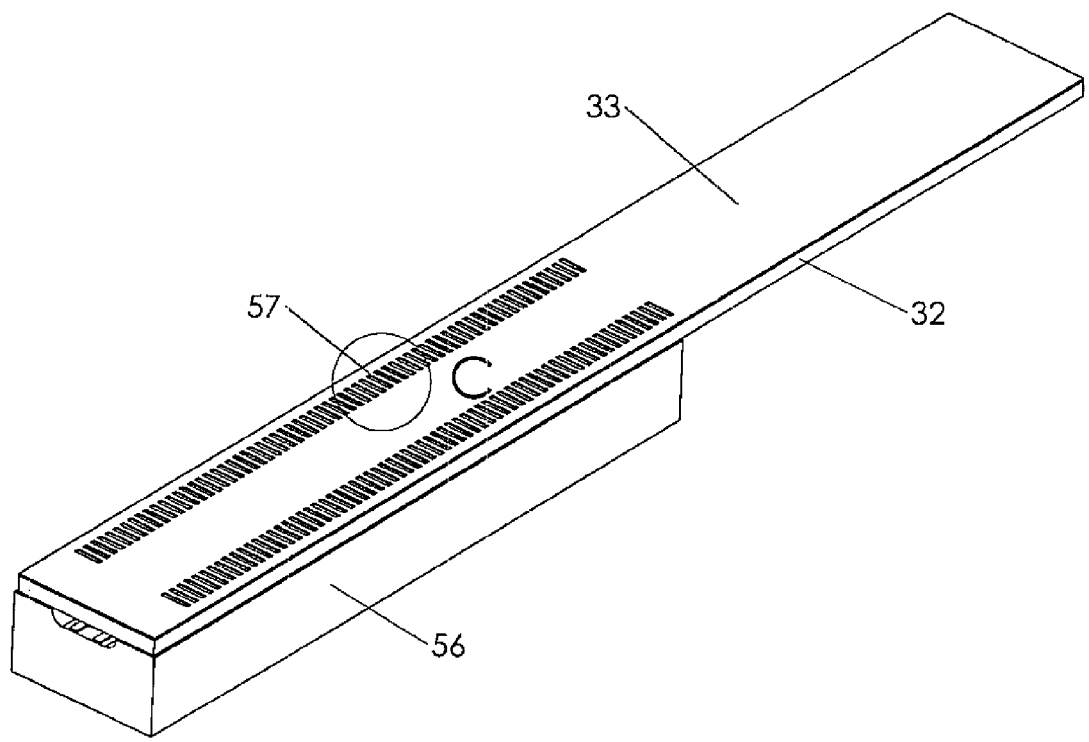
FIG. 16a is a perspective view of the buried oxide layer of the SOI wafer that has been partially etched.
Figure 16B:
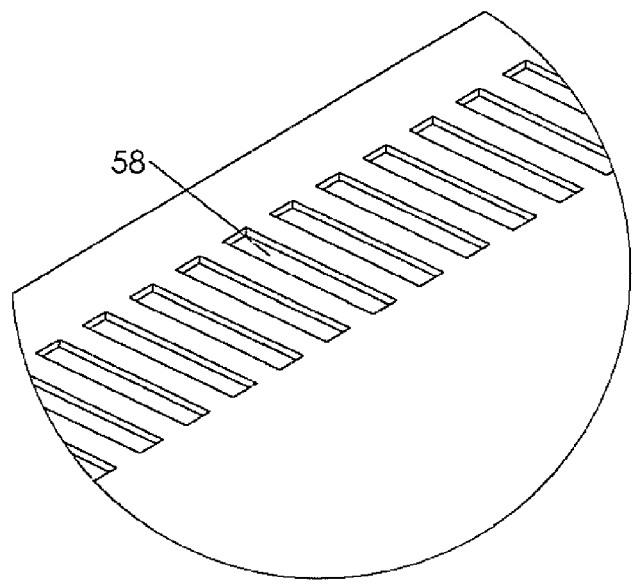

The self alignment process is applied to achieve the equal gap between adjacent movable and fixed comb fingers. Any unequal gap between adjacent movable and fixed comb fingers will cause asymmetry of electrostatic force, which in turn results in the malfunction of the vertical combdrive such as sidewall snapping movement of movable comb fingers. The BOX layer 33 shown in FIG. 16a is kept and used as silicon DRIE masking materials for the self alignment process. After photolithography, the partial RIE etching of BOX layer 33 is done to prepare to make the lower comb fingers. The BOX layer oxide partial etching regions 57 are shown in FIG. 16a, while the partial RIE oxide etching cavity 58 is shown in FIG. 16b.

Figure 17A:
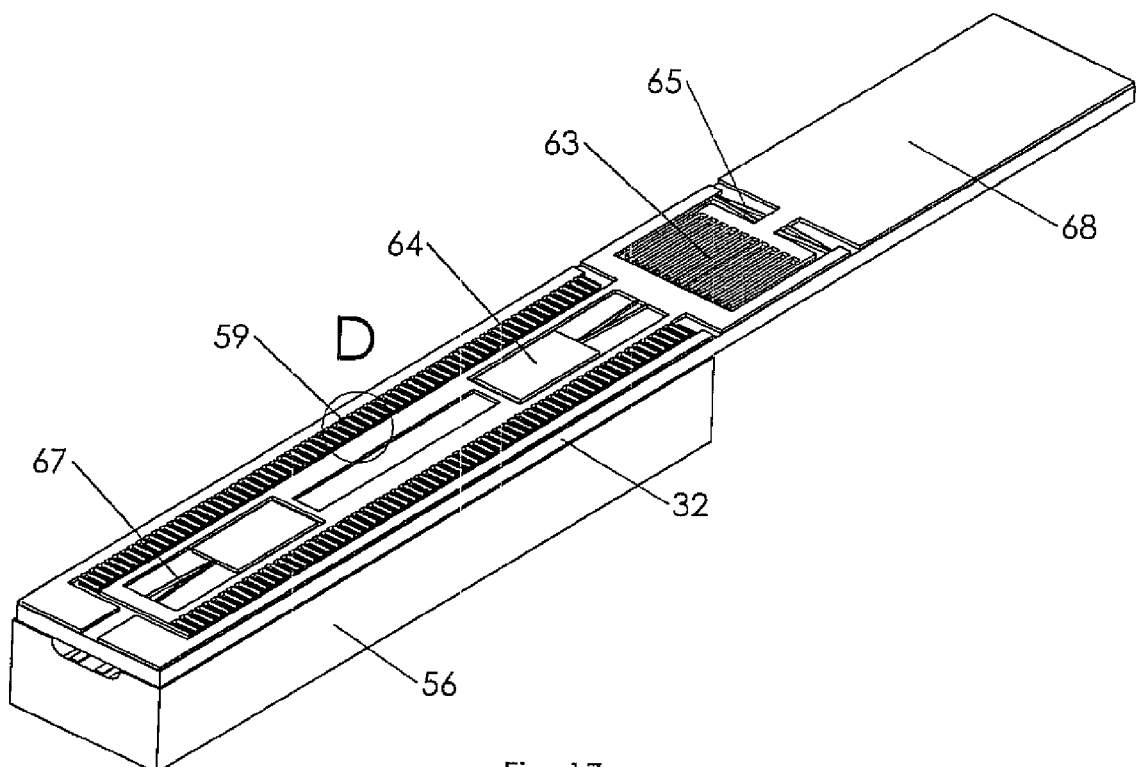
FIG. 17a is a perspective view of a fully etched pattern of the buried oxide layer of the SOI wafer.
Figure 17B:
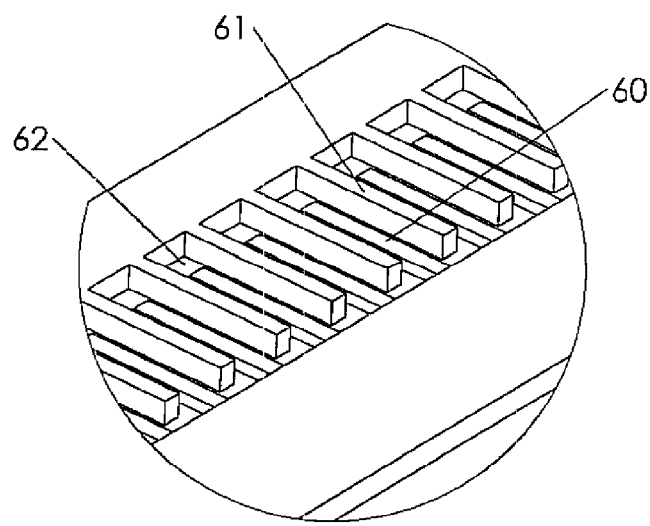

A subsequent photolithography is done after the partial BOX oxide etching, where a layer of photoresist is coated on the wafer to be patterned. After this lithography, an oxide RIE is performed to pattern hinges 65 and 67, anchor 64, primary vertical combdrive actuator 59, and secondary vertical combdrive actuator 63 shown in FIG. 17a. In the detailed view of FIG. 17b, the upper comb fingers have the masking oxide layer 61 with the same thickness as the original buried oxide layer 33, while the lower comb fingers have the masking oxide layer 60 which is only a portion of the thickness of the original buried oxide layer 33. The exposed single crystal device silicon is indicated by 62.

Figure 18A:
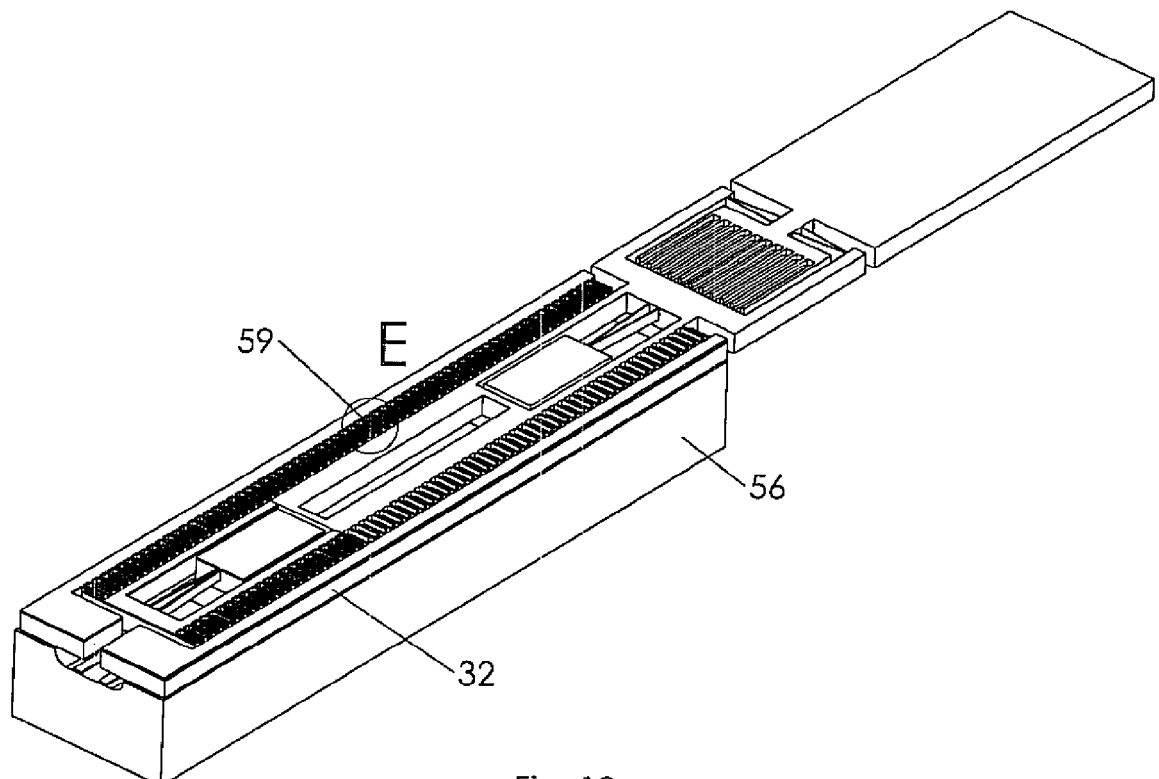
FIG. 18a is a perspective view of the SOI wafer after through device silicon layer DRIE silicon etching.
Figure 18B:
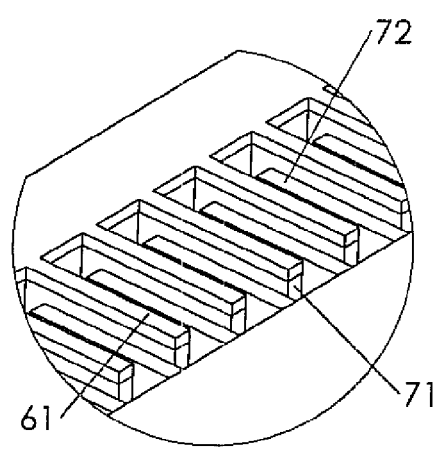

Following up the photolithography, silicon DRIE is used to etch through the single crystal device silicon as show in FIG. 18a. After this DRIE, an oxide RIE is utilized to etch away any remaining oxide on the lower fingers 72 as shown in FIG. 18b, while the upper comb fingers 71 still have some remaining oxide 61

Figure 19A:
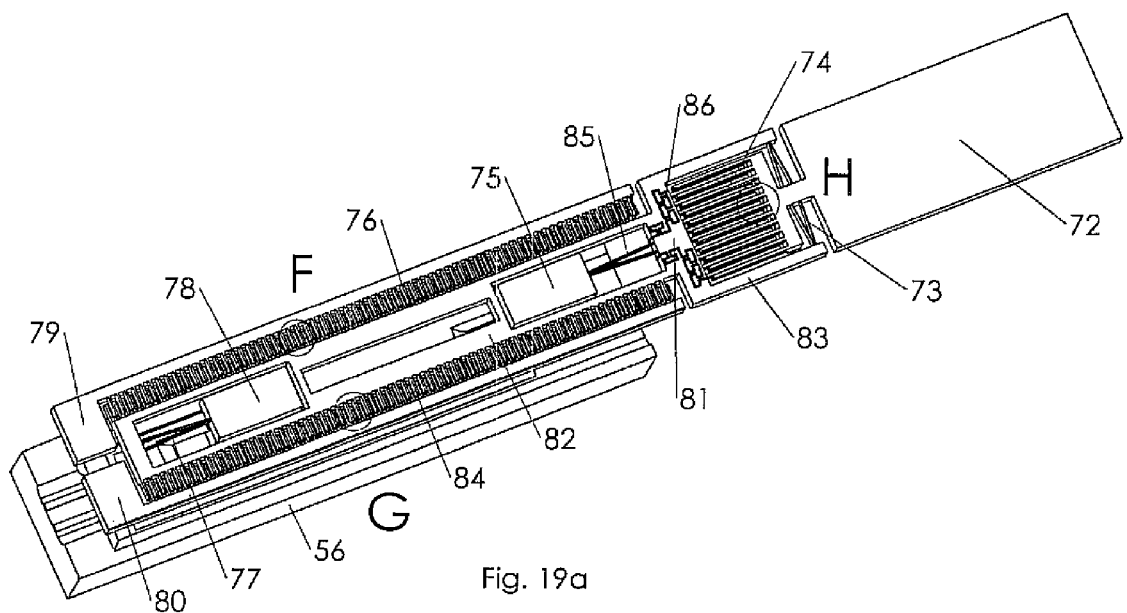
FIG. 19a is a perspective view of the SOI wafer of FIG. 18 after DRIE silicon etching to form the lower comb fingers.
Figure 19B:
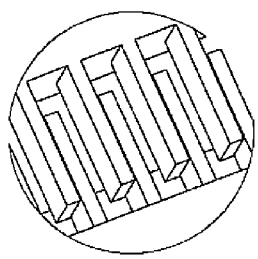
Figure 19C:
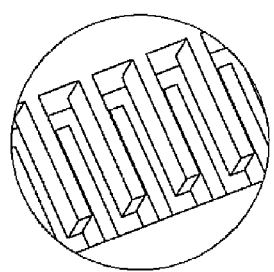
Figure 19D:
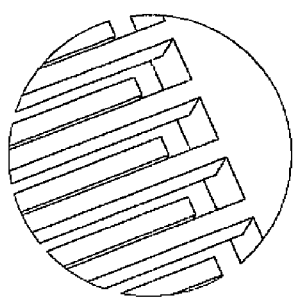

The last silicon DRIE is used to etch away the silicon on the top half of the lower comb fingers 72 to form its final shape, while the upper comb finger 71 is still protected by the remaining oxide 61. FIG. 19a shows the final shape of the micromirror and its vertical combdrive actuators after final oxide RIE removal, and FIGS. 19b, 19c and 19d show the details of upper and lower comb fingers of the primary and secondary actuators.

There are many microfabrication methods to deposit and pattern the reflective metal film on the mirror surface and bonding metal film on the anchors/bonding pads 75, 78, 79 and 80. One simple method is to perform metallization using sputtering or E-Beam evaporation with a shallow mask. Another method is to perform the metallization first and then pattern the metal layer before the self alignment process, and then use the patterned photoresist to protect the metal layer during subsequent self alignment process. In the end, the remaining metal protecting photoresist is removed using oxygen plasma.

Figure 20A:
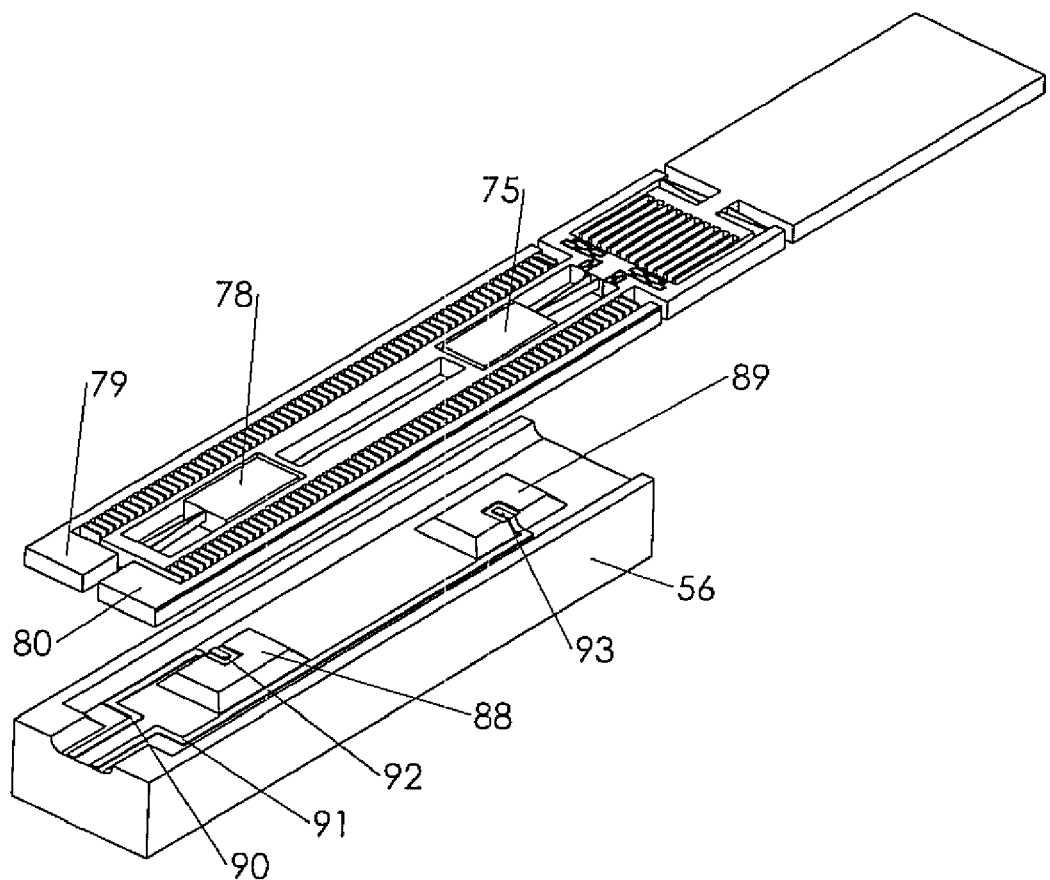
FIG. 20a is an exploded view of a micromirror, vertical combdrive actuators and carrier glass wafer with metal interconnection wires.

The design of micromirror and its corresponding vertical combdrive is shown in FIG. 19a. When the electrical potential is applied to the anchor 78, which may also serve as an electrical wire bonding pad depending on its size in the specific micromirror and micromirror arrays designs, mirror 72 with its movable comb fingers of the secondary vertical combdrive actuators will be at the same electrical potential as anchor 78, since mirror 72 is electrically connected with anchor 78 through its electrically conductive silicon hinge 73, electrical conductive silicon frame 83 of the secondary rotation actuator, electrical conductive silicon frame 82 of the primary rotation actuator and electrically conductive silicon hinge 77, The movable comb fingers of the primary rotation actuator 76 and 84 are also electrically connected with anchor 78 through the electrical conductive silicon frame 82. Usually, the anchor 78 is chosen to connect to the electrical ground by metal wire bonded to the metal film on its top, or through contacting the metal tab 92 of metal interconnection wire 90 on the glass etching cavity as shown in FIG. 20a.

The primary actuators 76 and 94 are responsible for the primary rotation of the mirror 72. If all the movable comb fingers on the silicon frame 82 are designed to be all upper fingers or all lower fingers while the fixed comb fingers on fixtures 79 and 80 are designed to be all lower or upper fingers, then the mirror can be rotated either clockwise or counterclockwise until a certain tilting angle is reached. Fixtures 79 and 80 are anchors that connect the etched wafer to the carrier wafer along with anchors 64 in FIG. 17a or anchors 75 and 78 that act as electrodes in FIG. 19a. As will be apparent, each of these anchors may perform a different function in addition. For example, fixtures 79 and 80 are used to support their fixed comb fingers. If an actuation voltage is only applied between the fixture 79 and anchor 78, the electrostatic force is created in primary combdrive 76 between the fixture 79 and the silicon frame 82. The corresponding torque resulting from the electrostatic force will rotate the mirror 72, for example clockwise, until a certain tilting angle is reached. On the other hand, if an actuation voltage is only applied between the fixture 80 and anchor 78, the electrostatic force is created in primary combdrive 84 between the fixture 80 and the silicon frame 82. The corresponding torque resulting from the electrostatic force will rotate the mirror 72, for example, counterclockwise, until a certain tilting angle is reached. The comb finger arrangement of actuator 76 and 84 can also be designed so that both actuators work together to actuate the mirror in a single direction.

Figure 20B:
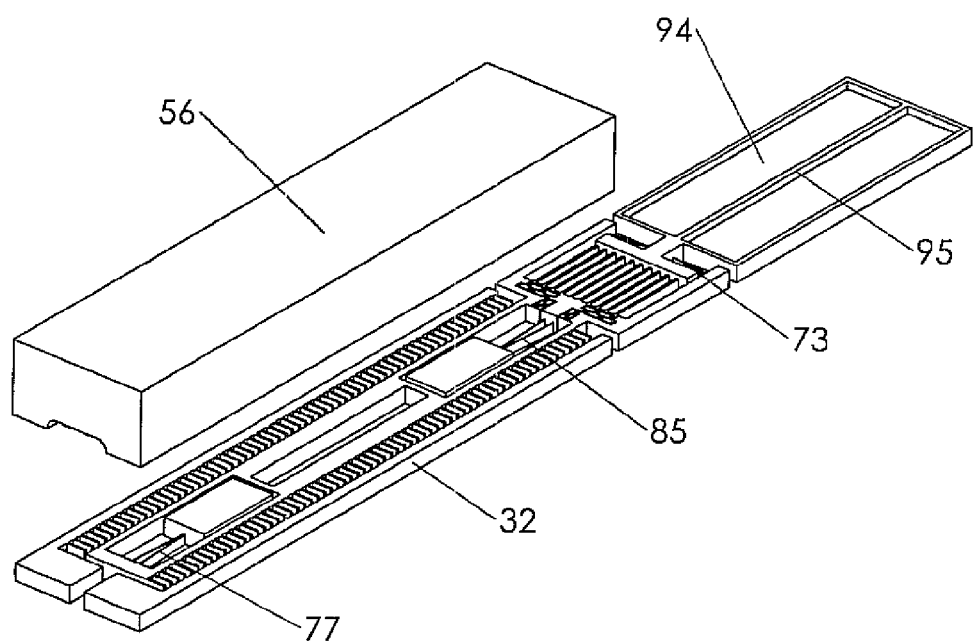
FIG. 20b is an exploded backside view of a micromirror, vertical combdrive actuators and carrier glass wafer with metal interconnection wires.

The anchor 75, silicon hinge 85, silicon connector 81 and the fixed comb fingers of the secondary vertical combdrive actuator on the silicon connector 81 are electrically isolated from other parts of the micromirror structure by the oxide filled trench 86. The movable comb fingers of the secondary actuator 74 are electrically connected to the anchor 78, which is usually an electrical ground. The actuation voltage for secondary rotation could be directly applied to the metal film on top of the anchor 75 shown in FIG. 19a, or through the metal tab 93 of metal interconnection wire 91 on the glass etching cavity, as shown in FIG. 20a. Once the actuation voltage is applied to anchor 75 shown in FIG. 19a and FIG. 20a, the mirror 72 will have secondary tilting due to the electrostatic force created in secondary actuator 74. Detailed views of comb finger designs for actuators 76, 84 and 74 are shown in FIGS. 19b, 19c and 19d. FIG. 20b shows the backside view of the silicon mirror and its actuators. A partially etched silicon cavity 94 (FIG. 20b) is on the backside of the mirror to reduce the mirror mass and increase its response speed of the actuation. The strengthen silicon bar 95 is used to maintain the stiffness and strength of the mirror.

The structure design described above of primary and secondary actuators eliminates any mechanical coupling between primary rotation and secondary rotation. If the anchor 78 is connected to the electrical ground, the primary and secondary rotations of the mirror will be independently controlled by the amount of voltage on fixture 79 and/or 80, and anchor 75. As depicted, the arrangement of the micromirror is such that micromirror is away from the actuators and stands on one end of the micromirror device. There is no gimbal structure around the mirror. This arrangement provides excellent flexibility to form high fill factor micromirror arrays. Two examples of single row high fill factor arrays are shown in FIGS. 21 and 22.

Figure 21:
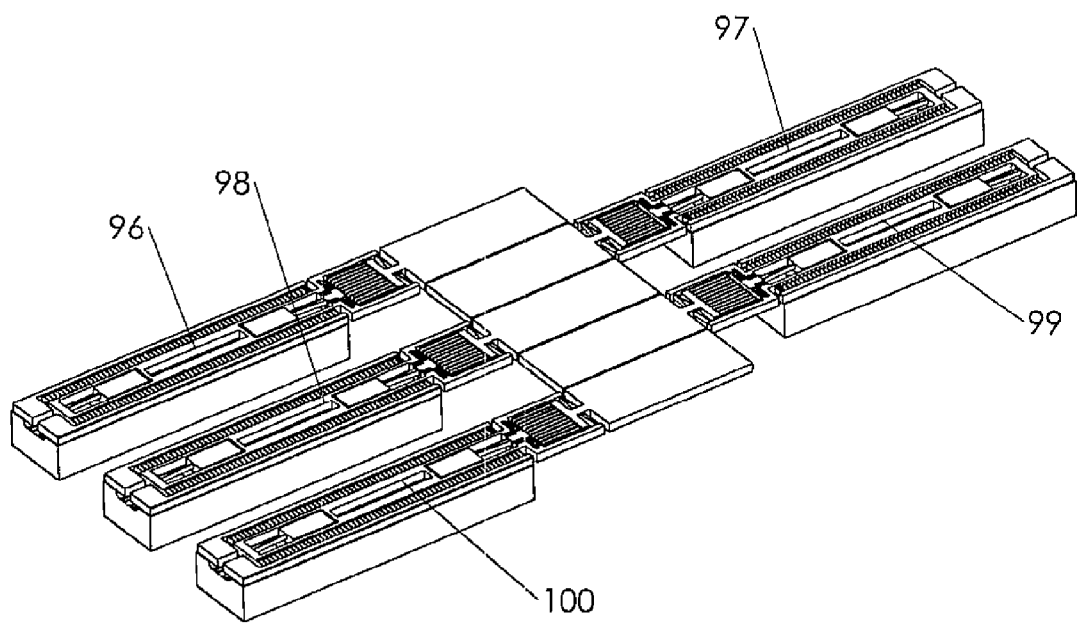
FIG. 21 is a perspective view of a single row micromirror array configuration.
Figure 22:
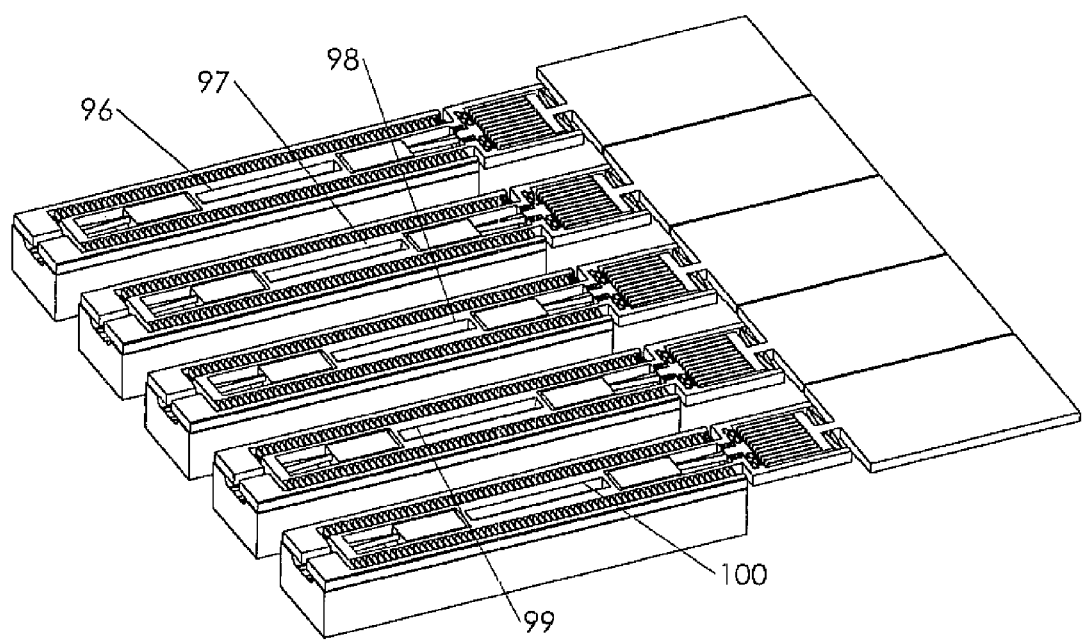
FIG. 22 is a perspective view of another single row micromirror array configuration.
Figure 23:
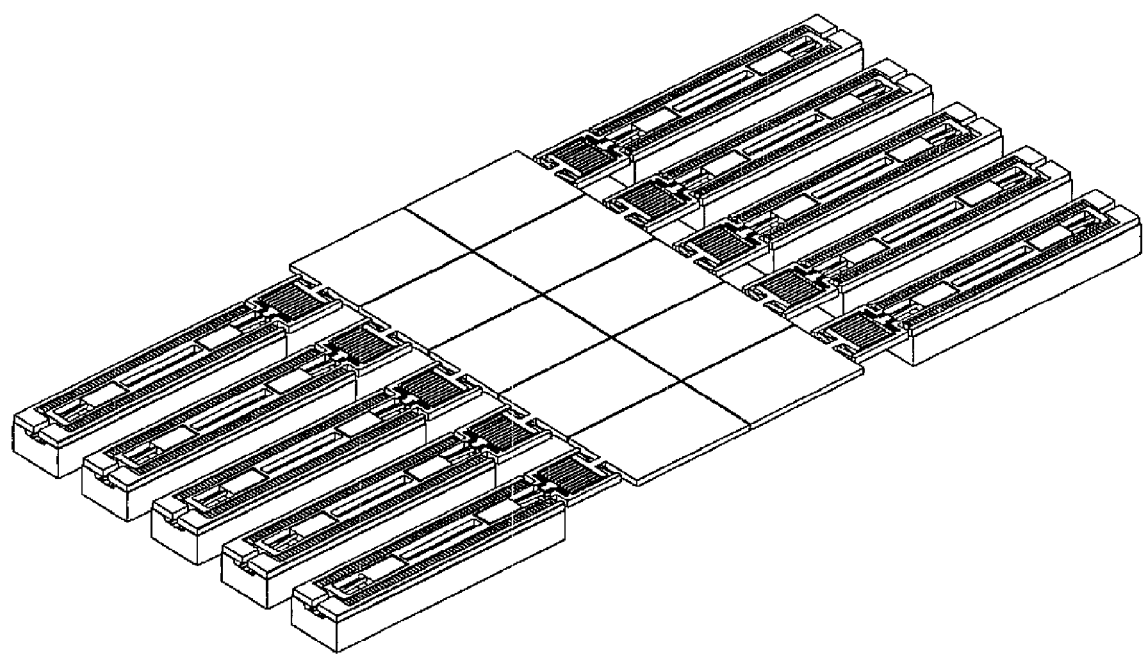
FIG. 23 is a perspective view of a double row micromirror array configuration.

If the micromirror width is small, in order to prevent the interference or crosstalk of primary actuators of adjacent two micromirrors, the configuration of the micromirror array shown in FIG. 21 should be used, where the actuators of adjacent two micromirrors are located on the different side of the micromirror. If the micromirror width is large, and the gap or space between adjacent primary rotation actuators is large enough to avoid any electrical actuation interference, the configuration of the micromirror array shown in FIG. 22 should be used, where all the actuators are located on the same side of the micromirrors. FIG. 23 shows a double row configuration for a micromirror array.

Figure 24A:
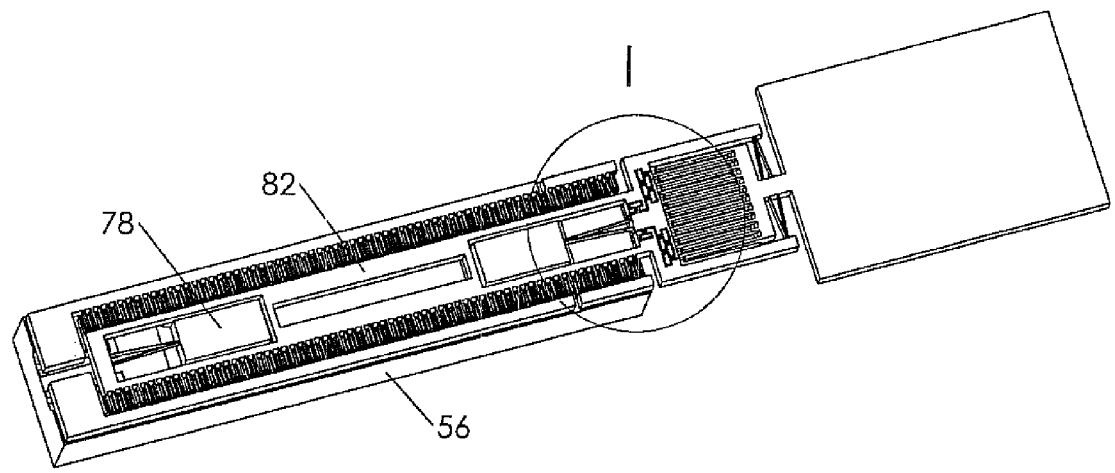
FIG. 24a is a perspective view of a micromirror with the tilting detection feature for primary rotation.
Figure 24B:
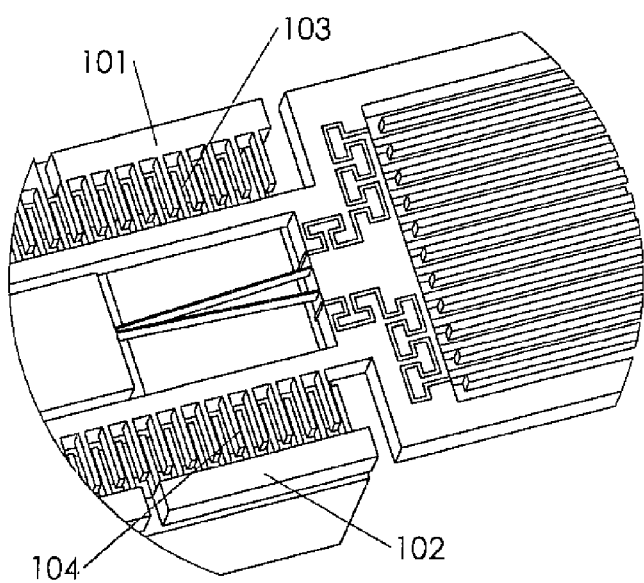
Figure 25:
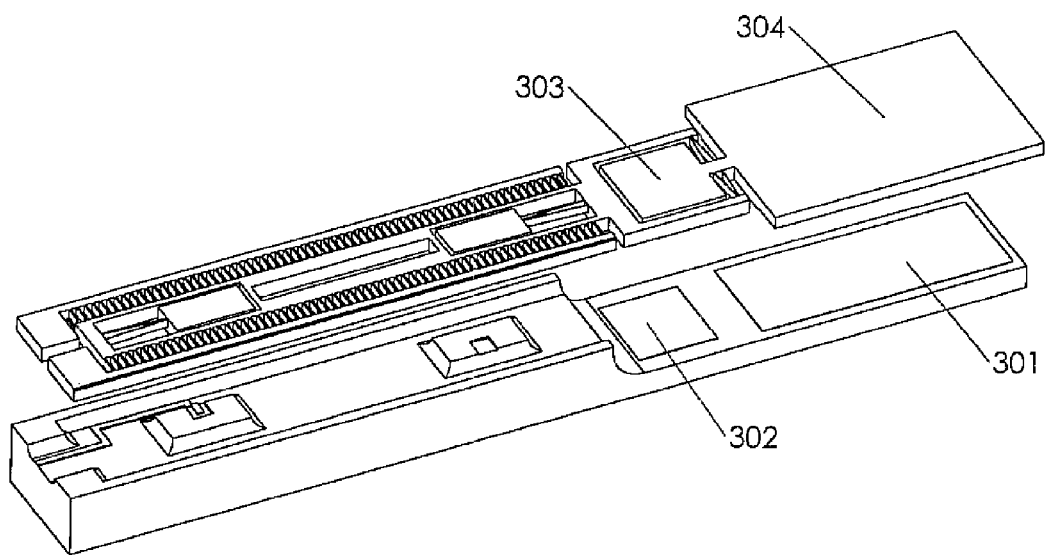
FIG. 25 is a perspective view of the two dimensional rotation mirror using metal electrodes on the carrier wafer for secondary rotation.

For some applications, the actual primary rotation is very important, and its rotation has to be electrically monitored. The device may then be designed to provide sensing structures to detect electrically the primary rotation of the micromirror. For example, the device may be designed to utilize a portion of vertical comb fingers of the primary actuators as the sensing structures, as shown in FIG. 24. The fixtures 101 and 102 are electrically isolated and mechanically separated from fixtures 79 and 80 respectively. The movable and fixed comb fingers in region 103 and 104 no longer act as electrostatic actuators; instead, they form variable electrical capacitors when the micromirror is rotated by the primary actuators. The primary rotation can be detected by measuring the capacitance in portion 103 or 104, or by measuring the differential capacitance changes between the portion 103 and 104.

Instead of trenching and dielectrical material refilling process to create the electrically isolated secondary actuator, the metal electrodes 301 and 302 can be formed on the etched cavity surface of the carrier wafer. The electrode 301 is underneath the mirror 304 and forming a parallel plate electrostatic actuator, while electrode 302 is underneath the paddle 303 and forming another parallel plate electrostatic actuator. These two actuators can be utilized to replace the secondary vertical combdrive actuator to control the secondary rotation of the mirror.

Figure 26:
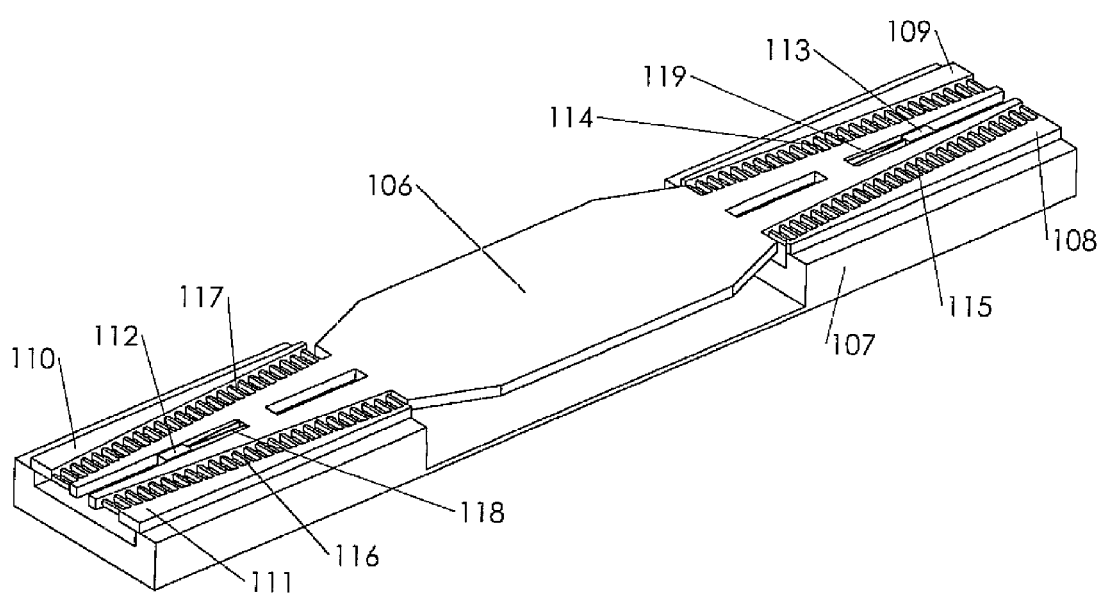
FIG. 26 is a perspective view of a low voltage driven, one dimensional rotation micro mirror.
Figure 27:
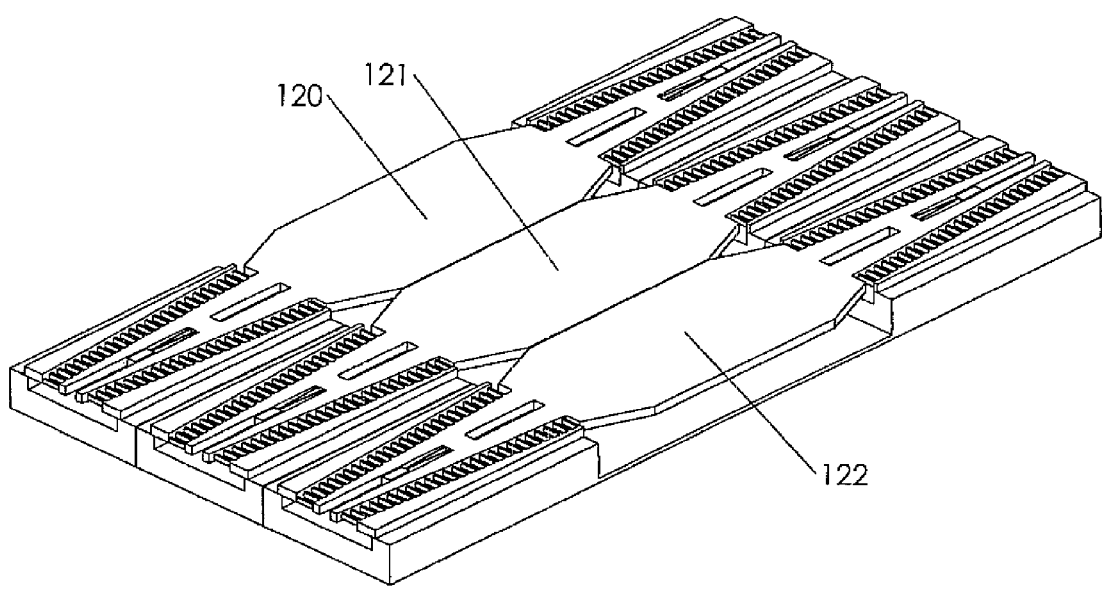
FIG. 27 is a perspective view of a low voltage driven, one dimensional rotation micromirror array.

Based on the same design and microfabrication method, low voltage driven, high fill factor and one directional rotation micromirror array can also be achieved. The micromirror 106 is supported be two hinges 118 and 119 which are connected to the anchor 112 and 113 (FIG. 26). All the vertical combdrive actuators 114, 115, 116 and 117 are working together to actuate the micromirror 106 towards the same direction. This approach will significantly reduce the actuation voltage while the quicker repose of the micromirror is still maintained. This micromirror configuration is especially useful for such devices as wavelength blocker, VOA (Variable Optical Attenuator) and VOA array, configurable grating etc. with low driving voltage such as less than 5 Volts. One of the array configurations using this kind of micromirror is shown in FIG. 27.

Figure 28A:
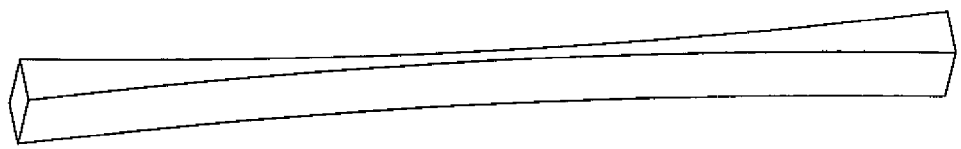
FIG. 28a is a perspective view of taper shape hinge.
Figure 28B:
FIG. 28b is a perspective view of double beam shape hinge.

The micromirror can have a variety of hinge shape designs. A V shape hinge is shown in some of the drawings such as FIG. 19a, however, other hinge designs are also used such as a taper shape hinge shown in FIG. 28a, or a double beam hinge shown in FIG. 28b. The V shape hinge, taper shape hinge and double beam hinge design provide very good rotation stability in terms of preventing side snapping of vertical combdrive actuator due to the process imperfection. Imperfection of microfabrication processes is one of major reasons to cause side snapping of the combdrive actuators.

The teachings in this document provide Micro-Electro-Mechanical-Systems (MEMS) micromirrors for high fill factor arrays. The electrostatic vertical combdrive may be used for the actuation of the mirror. The vertical combdrive has good linearity for the actuation with no pull-in effect. The vertical combdrive actuator provides large tilting angle at low actuation voltage. It eliminates mirror tilting drifting due to electrical charging, interference of adjacent mirrors, and squeezed air damping. The actuation of primary and secondary rotation is totally decoupled, which results in the simpler electrical control system. Further more, the micromirror may be designed to have a tilting sensing feature to monitor the position of the mirror along primary rotation axis. This may be done by electrically isolating one combdrive actuator, and connecting it to a detector to measure the capacitance. The capacitance between the fixed and movable fingers will change as they move relative to each other such that the capacitance give an indication of the rotation between the fixed and movable fingers. If the direction of movement is known, the position of the mirror can then be determined.

The present teachings offers micromirror array with higher than 95% of fill factor at lower than 100 volts of actuation voltage. The design and fabrication method of micromirrors and micromirror arrays could be used for optical switch especially optical multi wavelength selective switch, optical scanner, and optical variable attenuator, optical tunable filter, optical display device, compact spectrometer, and wavelength blocker etc.

In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

It will be apparent to one skilled in the art that modifications may be made to the illustrated embodiment without departing from the spirit and scope of the device as hereinafter defined in the Claims.

I claim:

1. A micro-electro-mechanical-system micromirror for use in high fill factor arrays, comprising:
    at least one stationary body;
    a movable body having opposed sides and being secured to the stationary body at each of the opposed sides by a resilient primary axis pivot;
    a mirror support supported by and movable with the movable body, the mirror support having a first unfettered side and a second unfettered side;
    a primary axis actuator comprising a fixed portion connected to the stationary body, and a movable portion connected to the movable body, the movable portion being movable relative to the fixed portion in response to an electrical potential difference between the fixed portion and the movable portion, such that the movable body rotates about the primary axis resilient pivot;
    a secondary axis resilient pivot positioned between the mirror support and the movable body;
    a secondary axis actuator, the secondary axis actuator comprising a fixed portion connected to the movable body, and a movable portion connected to the mirror support, the movable portion moving away from the fixed portion in response to an electrical potential difference between the fixed portion and the movable portion, such that the mirror support rotates about the secondary axis resilient pivot; and
    a mirror supported by the mirror support.

2. The micro-electro-mechanical-system micromirror of claim 1, wherein the at least one stationary body is mounted to a carrier wafer, the at least one stationary body comprising anchors for mounting the resilient primary axis pivot and the fixed portion of the primary axis actuator to the carrier wafer.

3. The micro-electro-mechanical-system micromirror of claim 2, wherein the carrier wafer is a Pyrex glass wafer or a silicon wafer.

4. The micro-electro-mechanical-system micromirror of claim 2, wherein the carrier wafer is etched to form supporting structures, the anchors being mounted to the supporting structures and to form a cavity or through hole below at least one of the mirror support and the movable body.

5. The micro-electro-mechanical-system micromirror of claim 1, wherein the mirror support extends in a cantilever fashion from one end of the movable body and has a remote unfettered end.

6. The micro-electro-mechanical-system micromirror of claim 5, wherein at least three of the micro-electro-mechanical-system micromirrors are arranged in an array with each body positioned in parallel spaced relation with the first unfettered side of a mirror support of a first of the at least three micro-electro-mechanical-system micromirrors is positioned immediately next to the second unfettered side of a mirror support for a second of the at least three micro-electro-mechanical-system micromirrors and the second unfettered side of the first mirror support of the first of the at least three micro-electro-mechanical-system micromirrors positioned immediately next to the first unfettered side of a mirror support for a third of the at least three micro-electro-mechanical-system micromirrors.

7. The micro-electro-mechanical-system micromirror of claim 5, wherein at least three of the micro-electro-mechanical-system micromirrors are arranged in an array with each body positioned along parallel axes in an alternating pattern, with the first unfettered side of a mirror support for a first of the at least three micro-electro-mechanical-system micromirrors positioned immediately next to the first unfettered side of a mirror support for a second of the at least three micro-electro-mechanical-system micromirrors and the second unfettered side of the mirror support for the first of the at least three micro-electro-mechanical-system micromirrors is positioned immediately next to the second unfettered side of a mirror support for a third of the at least three micro-electro-mechanical-system micromirrors.

8. The micro-electro-mechanical-system micromirror of claim 5, wherein two of the micro-electro-mechanical-system micromirrors are arranged in end to end relation with the remote unfettered end of the mirror support for a first of the two micro-electro-mechanical-system micromirrors positioned immediately next to the remote unfettered end of the mirror support for a second of the two micro-electro-mechanical-system micromirrors.

9. The micro-electro-mechanical-system micromirror of claim 5, wherein at least three of the micro-electro-mechanical-system micromirrors are arranged in an array with each body positioned in parallel spaced relation with the first unfettered side of a mirror support of a first of the at least three micro-electro-mechanical-system micromirrors positioned immediately next to the second unfettered side of a mirror support for a second of the at least three micro-electro-mechanical-system micromirrors and the second unfettered side of the first mirror support of the first of the at least three micro-electro-mechanical-system micromirrors is positioned immediately next to the first unfettered side of a mirror support for a third of the at least three micro-electro-mechanical-system micromirrors and each of the at least three micro-electro-mechanical-system micromirror are arranged in end to end relation with other micro-electro-mechanical-system micromirror with the remote unfettered end of the mirror support for each of the at least three micro-electro-mechanical-system micromirrors being positioned immediately next to the remote unfettered end of the mirror support of other micro-electro-mechanical-system micromirror.

10. The micro-electro-mechanical-system micromirror of claim 1, wherein at least one of the primary axis actuator and the secondary axis actuator is a vertical combdrive actuator.

11. The micro-electro-mechanical-system micromirror of claim 1, wherein the at least one stationary body is mounted to a carrier wafer, the at least one stationary body comprising more than one anchor, the fixed portion of the secondary axis actuator being electrically connected to an electrode on the carrier wafer, the movable portion of the secondary axis being electrically connected to another electrode on the carrier wafer.

12. The micro-electro-mechanical-system micromirror of claim 11, the carrier wafer having supporting structures, the anchors being connected to the supporting structures, wherein the electrodes are formed on top of the supporting structures.

13. The micro-electro-mechanical-system micromirror of claim 1, wherein at least one of the primary axis actuator and the secondary axis actuator is a parallel plate electrostatic actuator.

14. The micro-electro-mechanical-system micromirror of claim 1, wherein the micromirror apparatus is etched from a single silicon wafer, with the primary axis actuator being electrically isolated from the secondary axis actuator.

15. The micro-electro-mechanical-system micromirror of claim 14, wherein the primary axis actuator and the secondary axis actuator are connected to an actuation electrical signal source by electrodes on the carrier wafer.

16. The micro-electro-mechanical-system micromirror of claim 14, wherein the primary axis actuator and the secondary axis actuator are electrically isolated by a trench filled with dielectric material.

17. The micro-electro-mechanical-system micromirror of claim 1, wherein each of the primary axis resilient pivot and the secondary axis resilient pivot are one of V-shaped, wedge-shaped, or parallel bands.

18. The micro-electro-mechanical-system micromirror of claim 1, wherein at least three of the micro-electro-mechanical-system micromirrors are arranged in an array with each body positioned in parallel spaced relation with the first unfettered side of a mirror support of a first of the at least three micro-electro-mechanical-system micromirrors positioned immediately next to the second unfettered side of a mirror support for a second of the at least three micro-electro-mechanical-system micromirrors and the second unfettered side of the first mirror support of the first of the at least three micro-electro-mechanical-system micromirrors positioned immediately next to the first unfettered side of a mirror support for a third of the at least three micro-electro-mechanical-system micromirrors.

19. The micro-electro-mechanical-system micromirror of claim 1, wherein the primary axis actuator comprises more than one vertical combdrive actuators, at least one of the vertical combdrive actuators being electrically isolated from the other vertical combdrive actuators such that the electrically isolated combdrive actuator acts as a position sensor for the primary axis actuator.

20. The micro-electro-mechanical-system micromirror of claim 19, wherein the capacitance of the electrically isolated combdrive actuator is related to the position of the primary axis actuator.

* * * * *